(12) United States Patent
Koka et al.

(10) Patent No.: US 9,478,558 B2
(45) Date of Patent: Oct. 25, 2016

(54) SEMICONDUCTOR STRUCTURE WITH CONCAVE BLOCKING DIELECTRIC SIDEWALL AND METHOD OF MAKING THEREOF BY ISOTROPICALLY ETCHING THE BLOCKING DIELECTRIC LAYER

(71) Applicant: SANDISK TECHNOLOGIES INC., Plano, TX (US)

(72) Inventors: Sateesh Koka, Milpitas, CA (US); Senaka Kanakamedala, Milpitas, CA (US); Raghuveer S. Makala, Campbell, CA (US); Rahul Sharangpani, Fremont, CA (US); Yanli Zhang, San Jose, CA (US); Yao-Sheng Lee, Tampa, FL (US); George Matamis, Danville, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/600,226

(22) Filed: Jan. 20, 2015

(65) Prior Publication Data

US 2016/0211272 A1  Jul. 21, 2016

(51) Int. Cl.
*H01L 21/8238*  (2006.01)
*H01L 27/115*  (2006.01)
*H01L 21/28*  (2006.01)
*H01L 29/788*  (2006.01)
*H01L 21/311*  (2006.01)
*H01L 29/66*  (2006.01)

(52) U.S. Cl.
CPC ... *H01L 27/11582* (2013.01); *H01L 21/28273* (2013.01); *H01L 21/28282* (2013.01); *H01L 21/31111* (2013.01); *H01L 27/11526* (2013.01); *H01L 27/11548* (2013.01); *H01L 27/11556* (2013.01); *H01L 27/11573* (2013.01); *H01L 27/11575* (2013.01); *H01L 29/6653* (2013.01); *H01L 29/7883* (2013.01)

(58) Field of Classification Search
CPC .................. H01L 27/11529; H01L 27/11524; H01L 27/1157; H01L 27/11582; H01L 27/11573
USPC ........ 257/324, 296, 314; 438/151, 197, 199, 438/216, 287, 263
See application file for complete search history.

(56) References Cited

U.S. PATENT DOCUMENTS 5,915,167 A   6/1999  Leedy
8,309,405 B2  11/2012 Yang et al.
(Continued)

OTHER PUBLICATIONS

U.S. Appl. No. 14/133,979, filed Dec. 19, 2013, SanDisk Technologies, Inc.
U.S. Appl. No. 14/225,116, filed Mar. 25, 2014, SanDisk Technologies, Inc.
(Continued)

*Primary Examiner* — Jarrett Stark
*Assistant Examiner* — Shahed Ahmed
(74) *Attorney, Agent, or Firm* — The Marbury Law Group PLLC

(57) ABSTRACT

A first blocking dielectric layer is formed in a memory opening through a stack of an alternating plurality of material layers and insulator layers. A spacer with a bottom opening is formed over the first blocking dielectric layer by deposition of a conformal material layer and an anisotropic etch. A horizontal portion of the first blocking dielectric layer at a bottom of the memory opening can be etched by an isotropic etch process that minimizes overetch into the substrate. An optional additional blocking dielectric layer, at least one charge storage element, a tunneling dielectric, and a semiconductor channel can be sequentially formed in the memory opening to provide a three-dimensional memory stack.

34 Claims, 26 Drawing Sheets

(56) References Cited

U.S. PATENT DOCUMENTS

| | | | |
|---|---|---|---|
| 2011/0309426 A1* | 12/2011 | Purayath | H01L 21/28273 257/316 |
| 2013/0034965 A1* | 2/2013 | Kim | H01L 21/0274 438/703 |
| 2013/0119455 A1* | 5/2013 | Chen | H01L 27/11578 257/324 |
| 2013/0279257 A1* | 10/2013 | Costa | G11C 5/02 365/185.17 |
| 2014/0035026 A1* | 2/2014 | Jang | H01L 29/792 257/324 |
| 2014/0151774 A1 | 6/2014 | Rhie | |
| 2014/0264533 A1* | 9/2014 | Simsek-Ege | H01L 27/1158 257/316 |

OTHER PUBLICATIONS

U.S. Appl. No. 14/225,176, filed Mar. 25, 2014, SanDisk Technologies, Inc.
U.S. Appl. No. 14/519,733, filed Oct. 21, 2014, SanDisk Technologies, Inc.
U.S. Appl. No. 14/523,287, filed Oct. 24, 2014, SanDisk Technologies, Inc.
U.S. Appl. No. 14/530,220, filed Oct. 31, 2014, SanDisk Technologies, Inc.
U.S. Appl. No. 14/539,307, filed Nov. 12, 2014, SanDisk Technologies, Inc.
U.S. Appl. No. 14/539,372, filed Nov. 12, 2014, SanDisk Technologies, Inc.

* cited by examiner

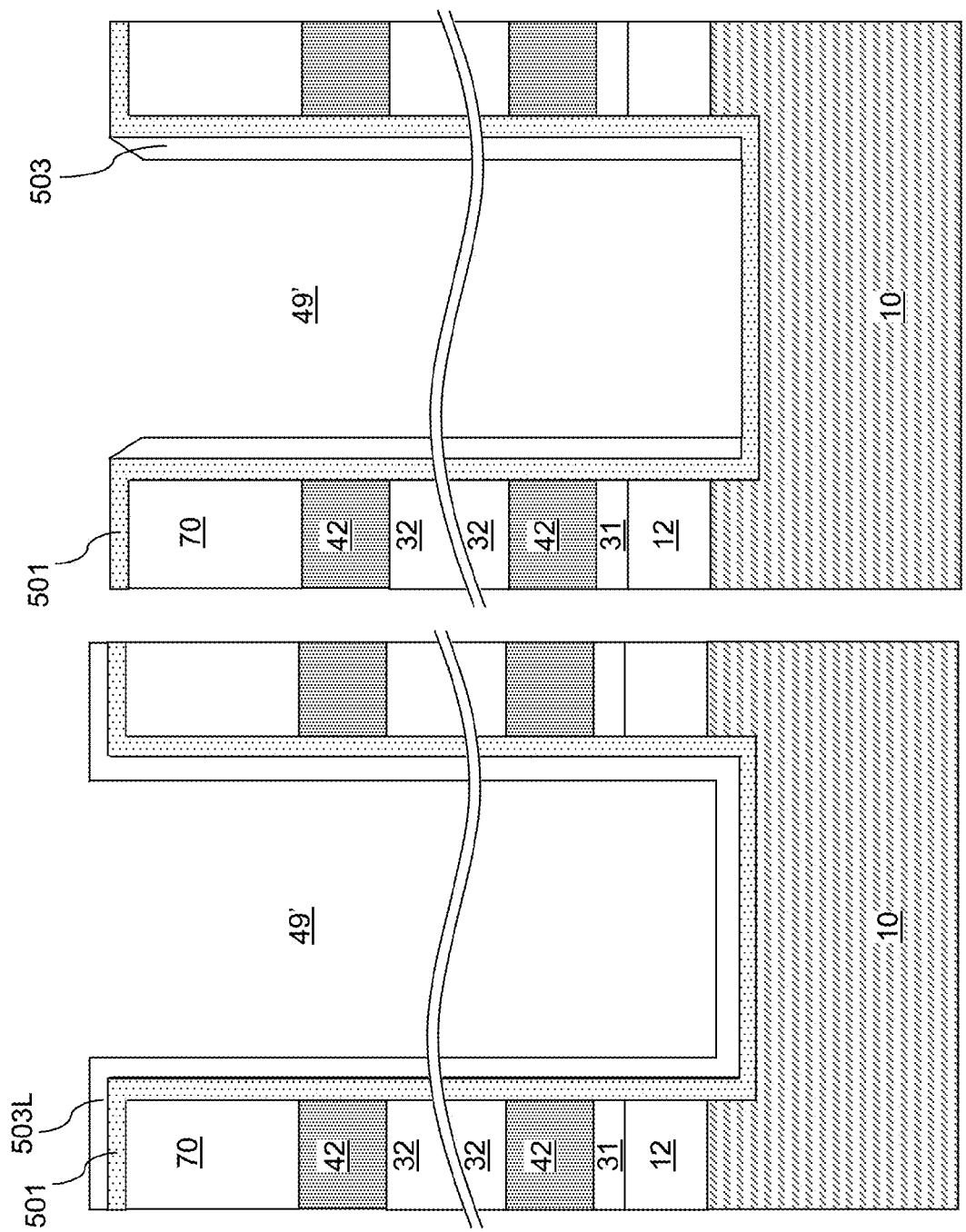

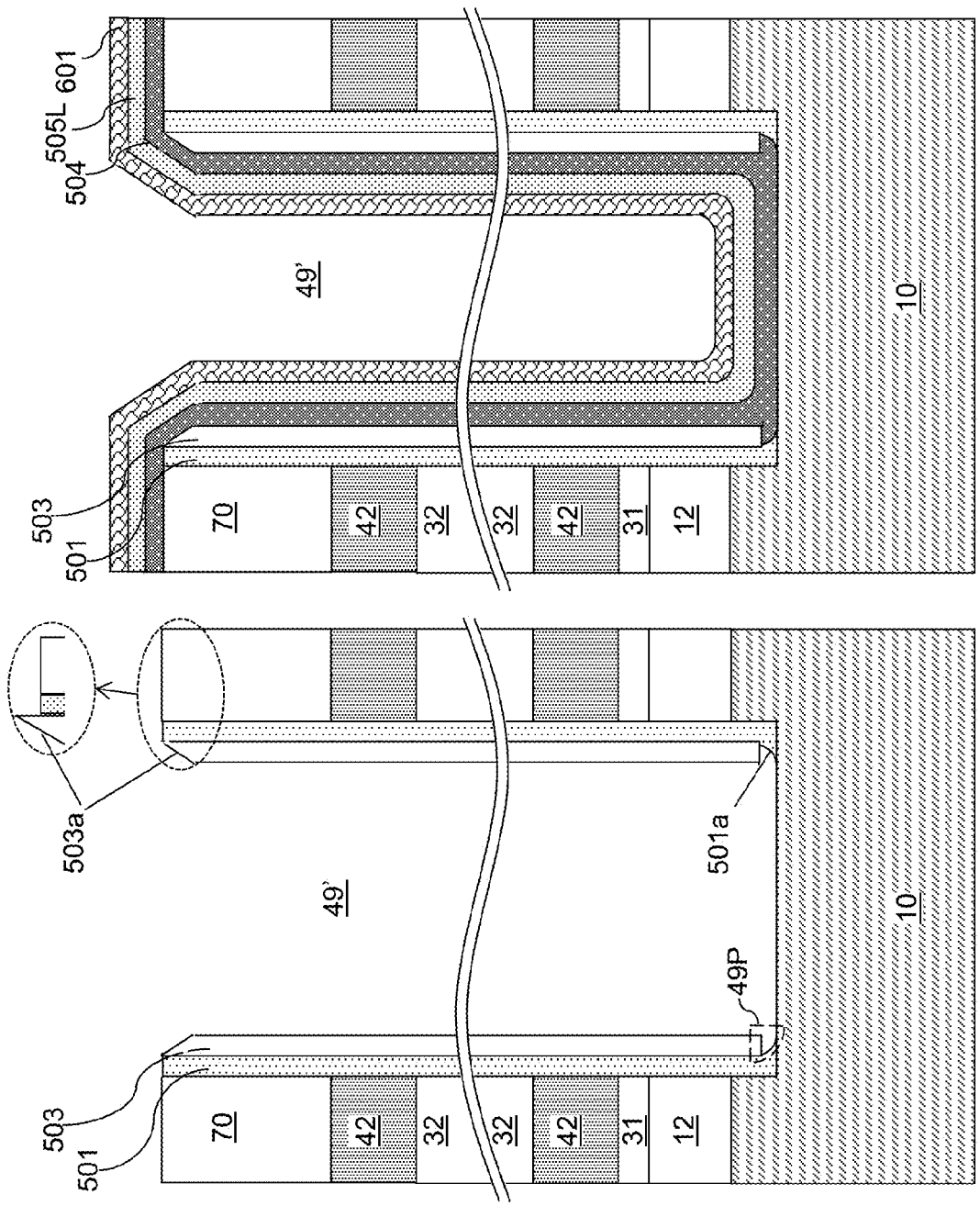

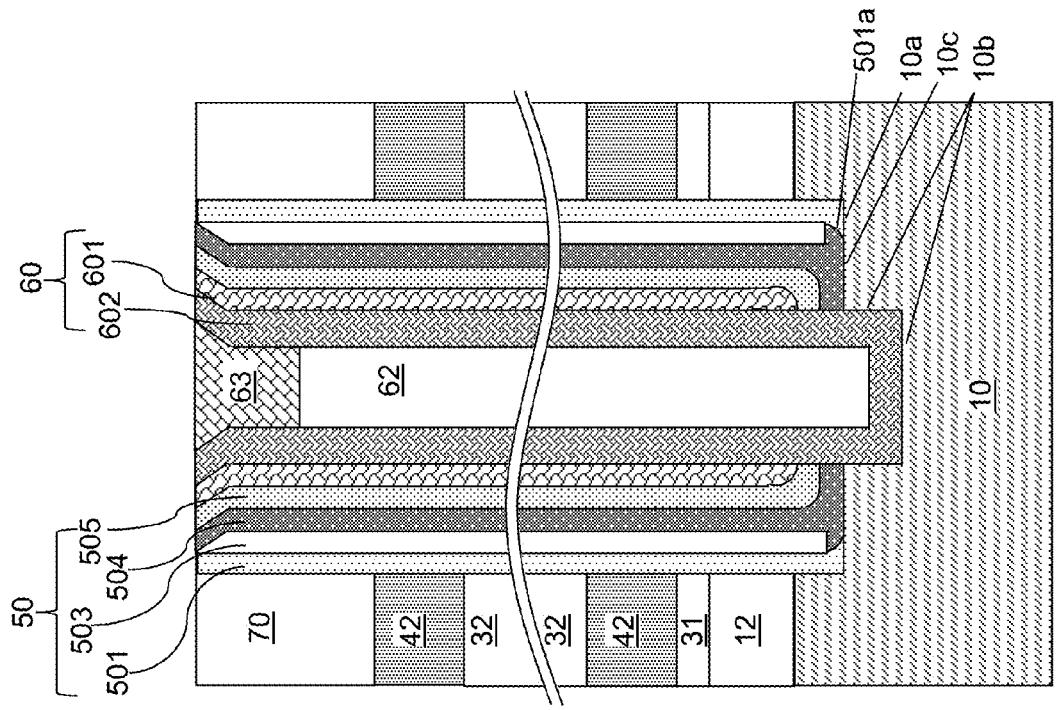
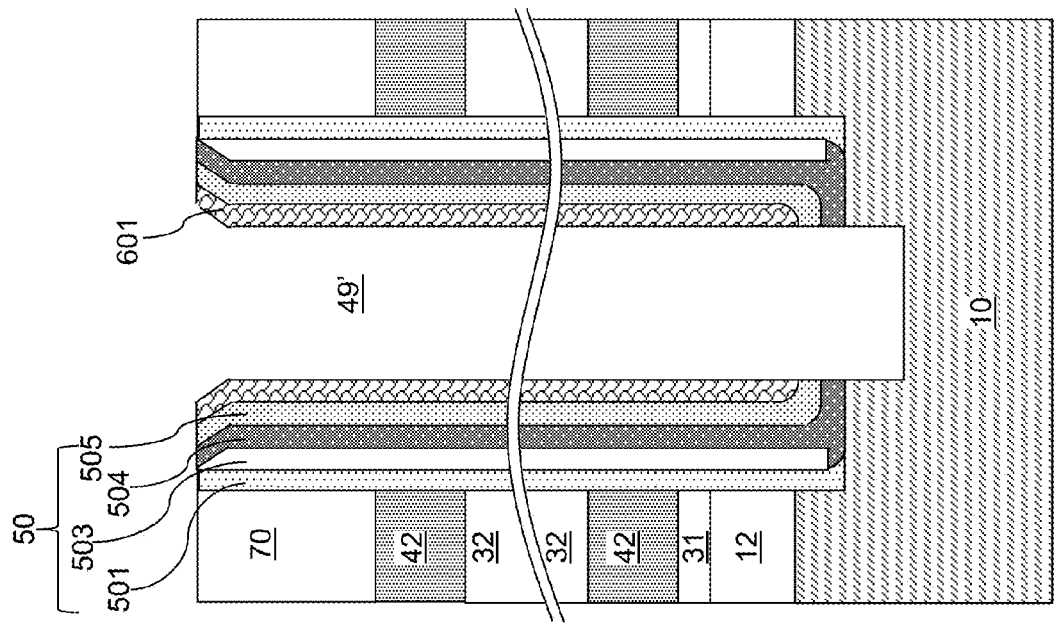
FIG. 2F
FIG. 2E

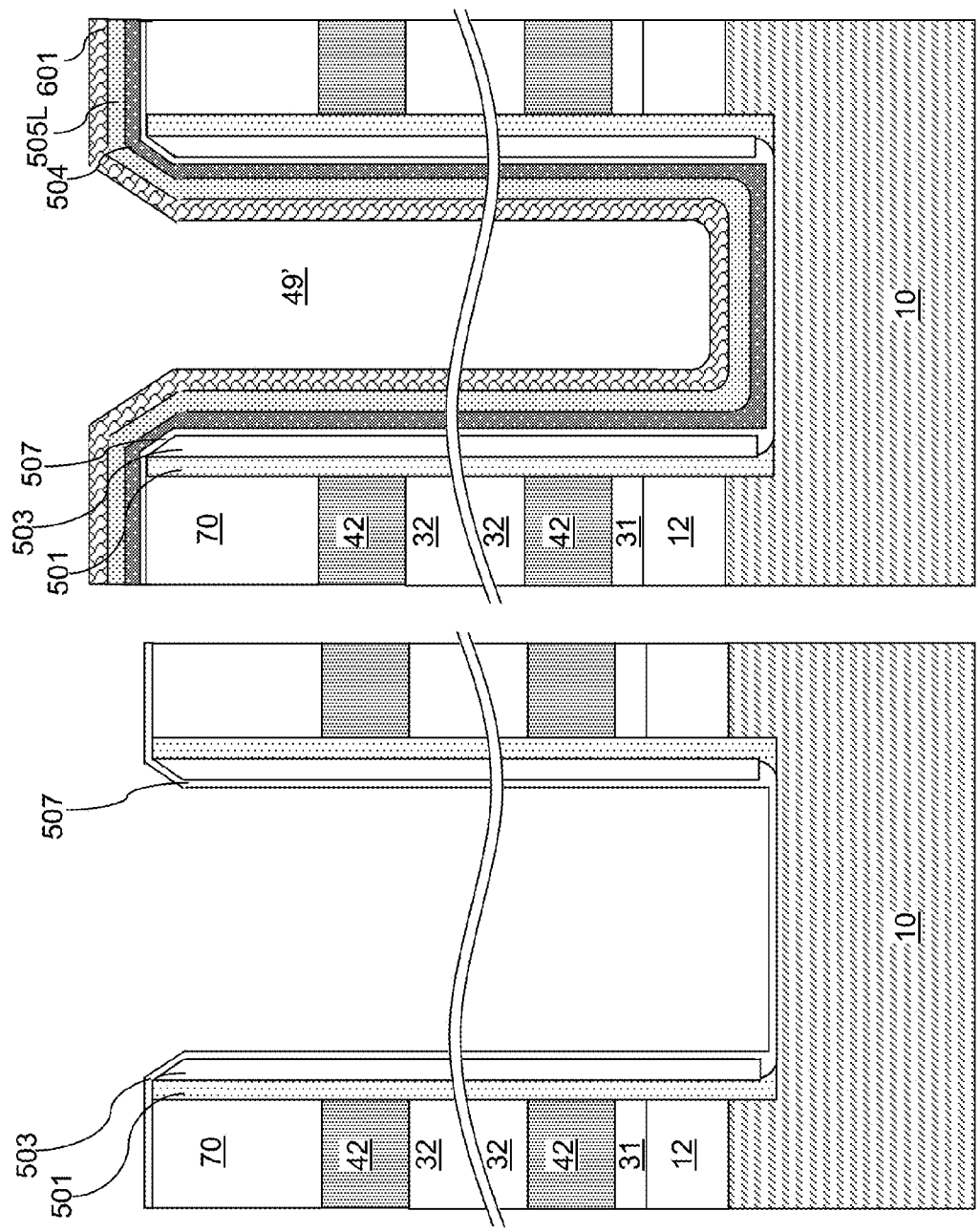

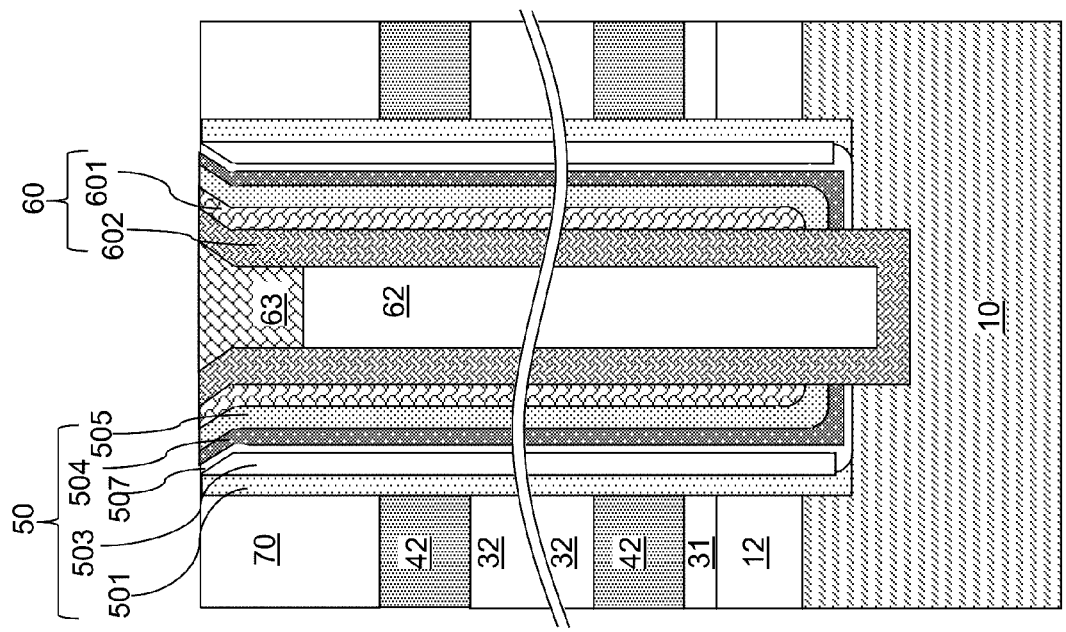
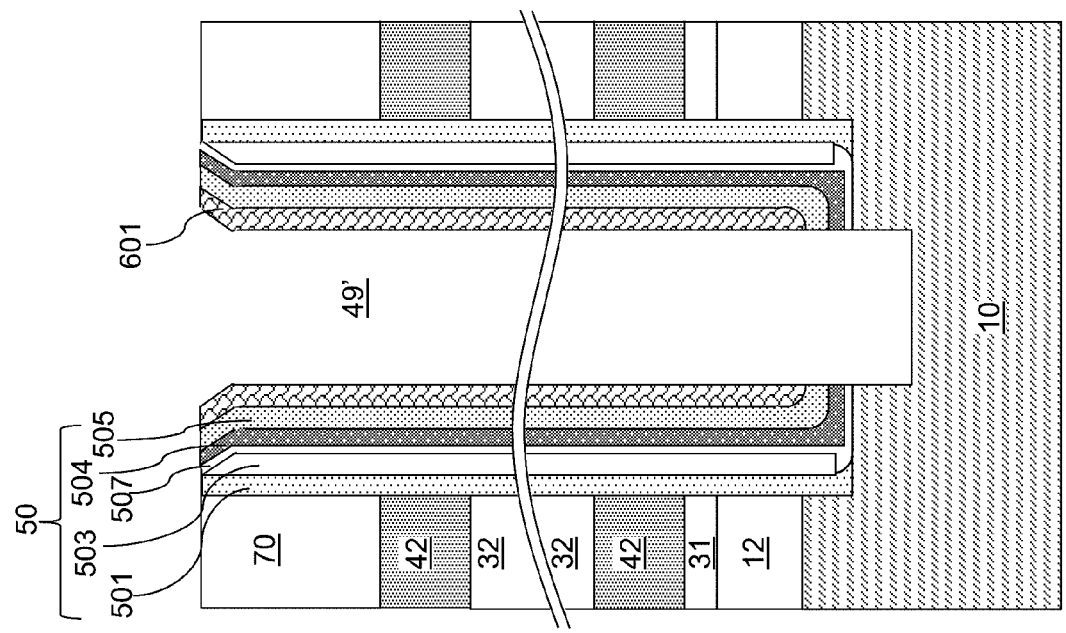
FIG. 3D
FIG. 3C

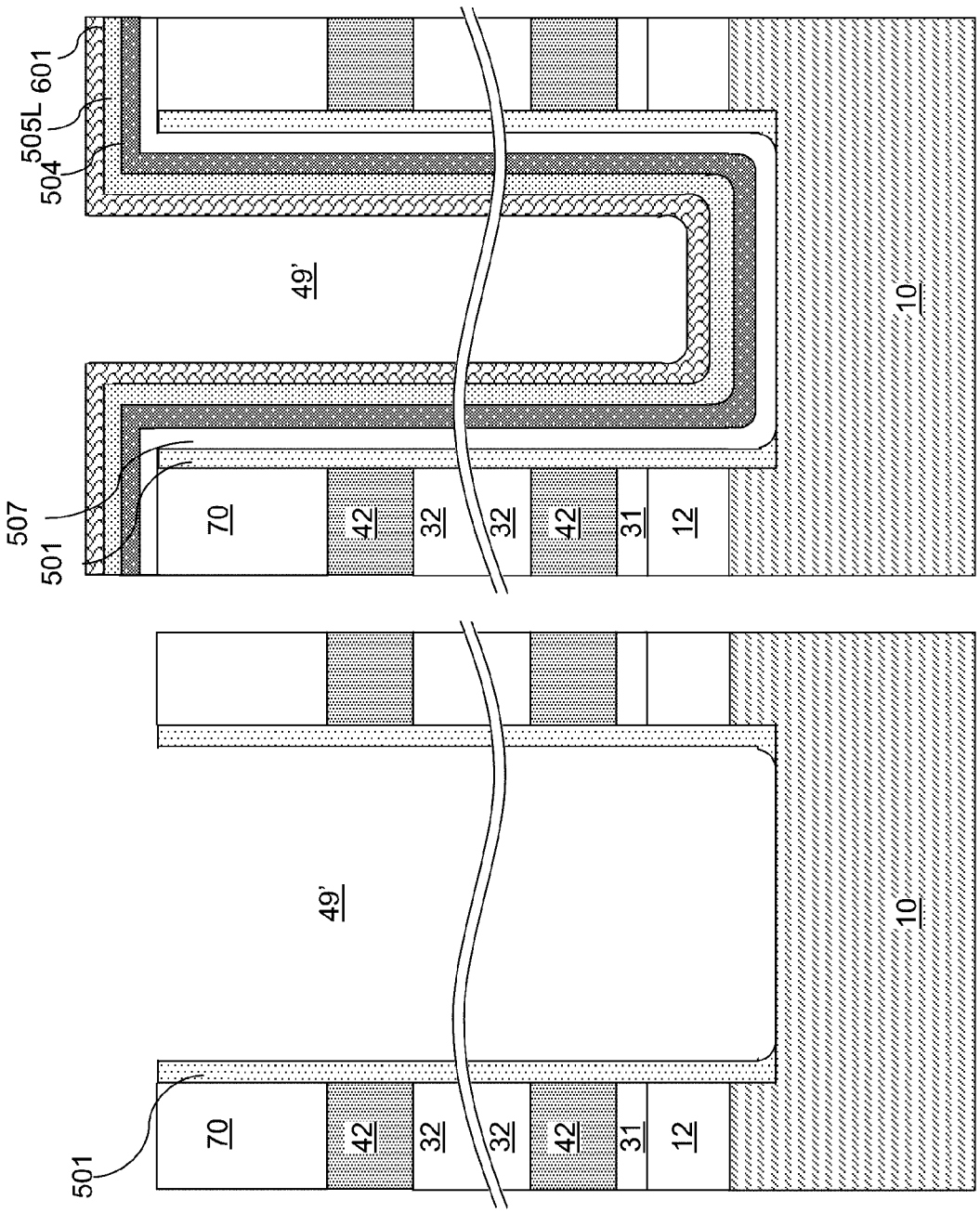

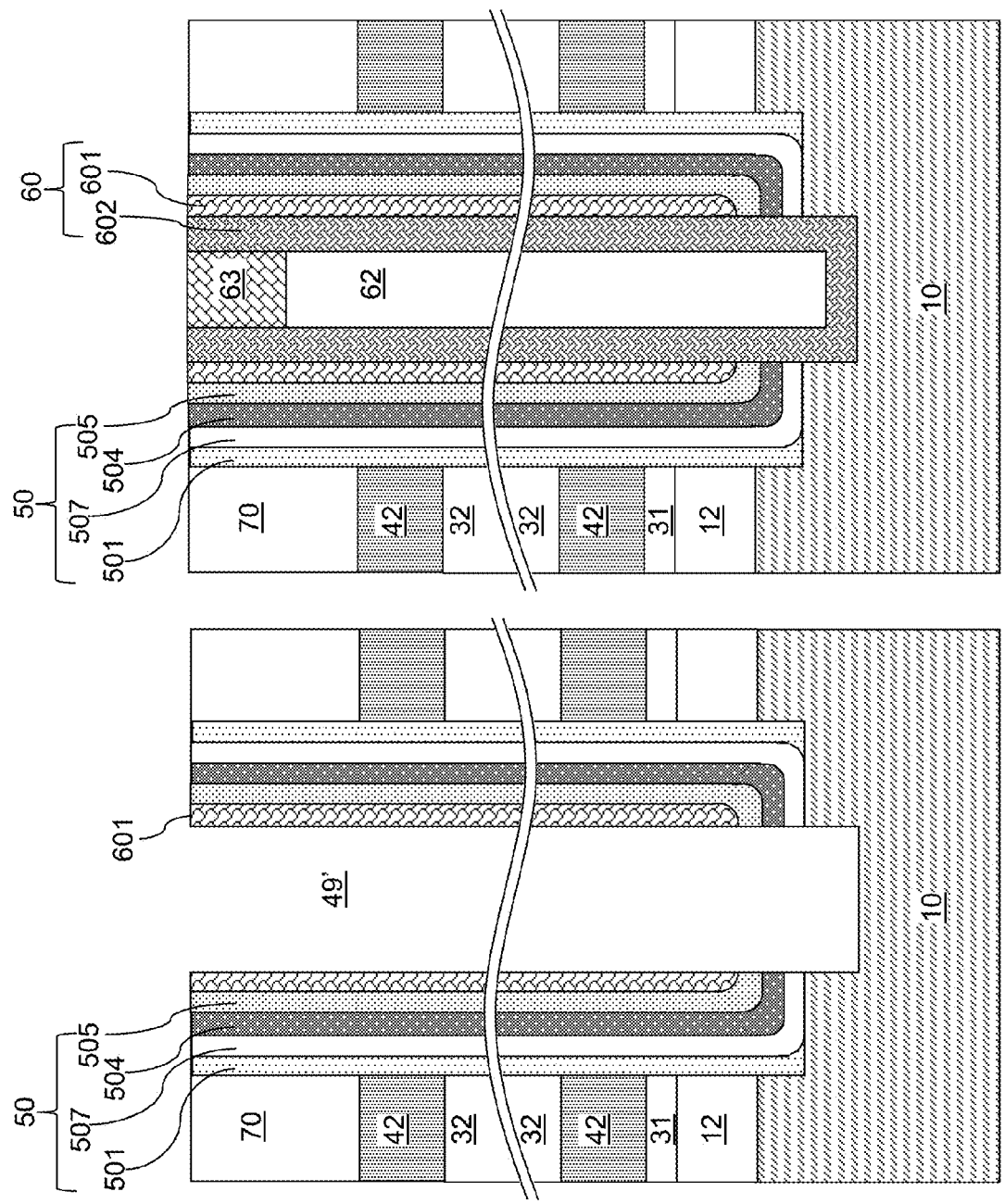

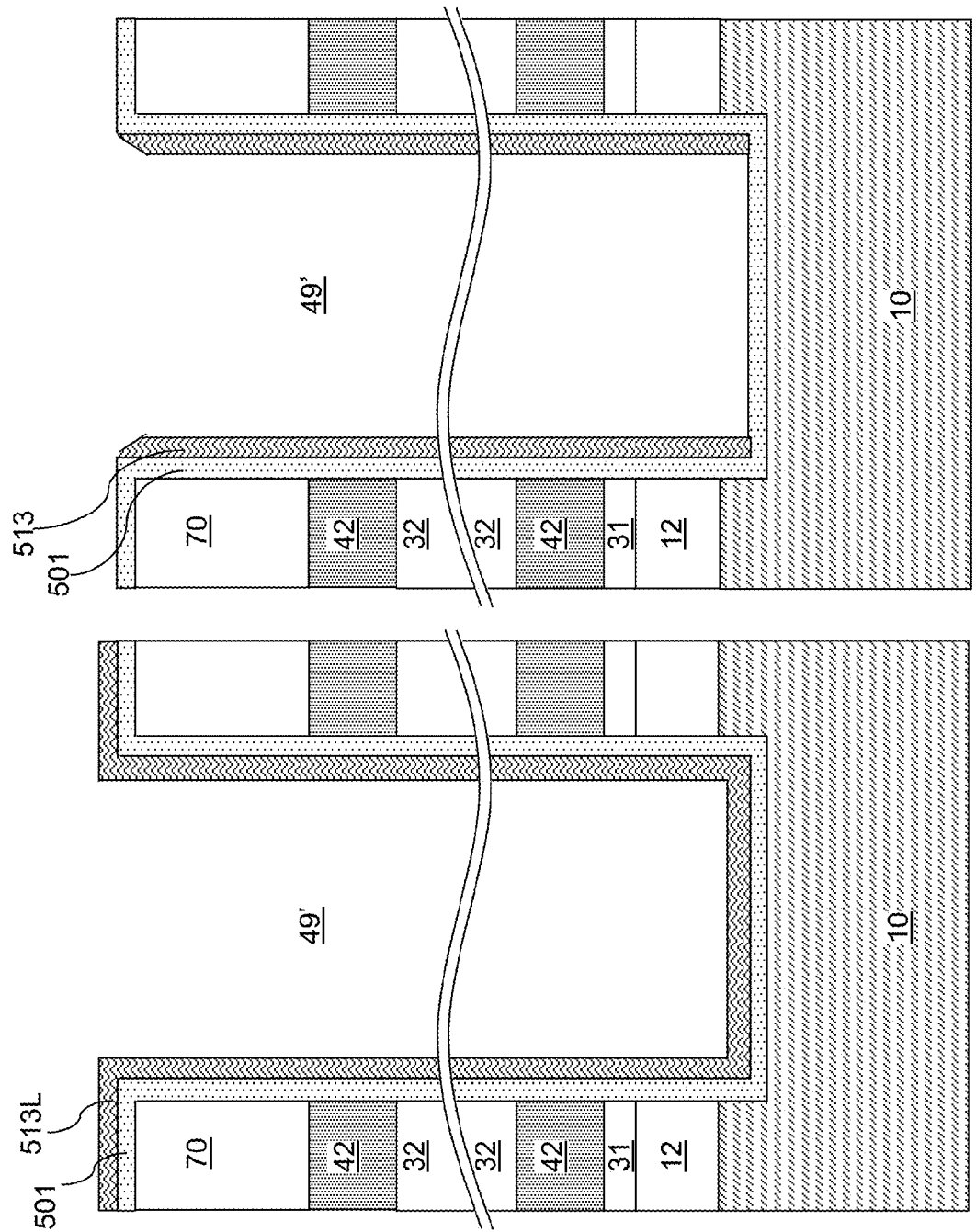

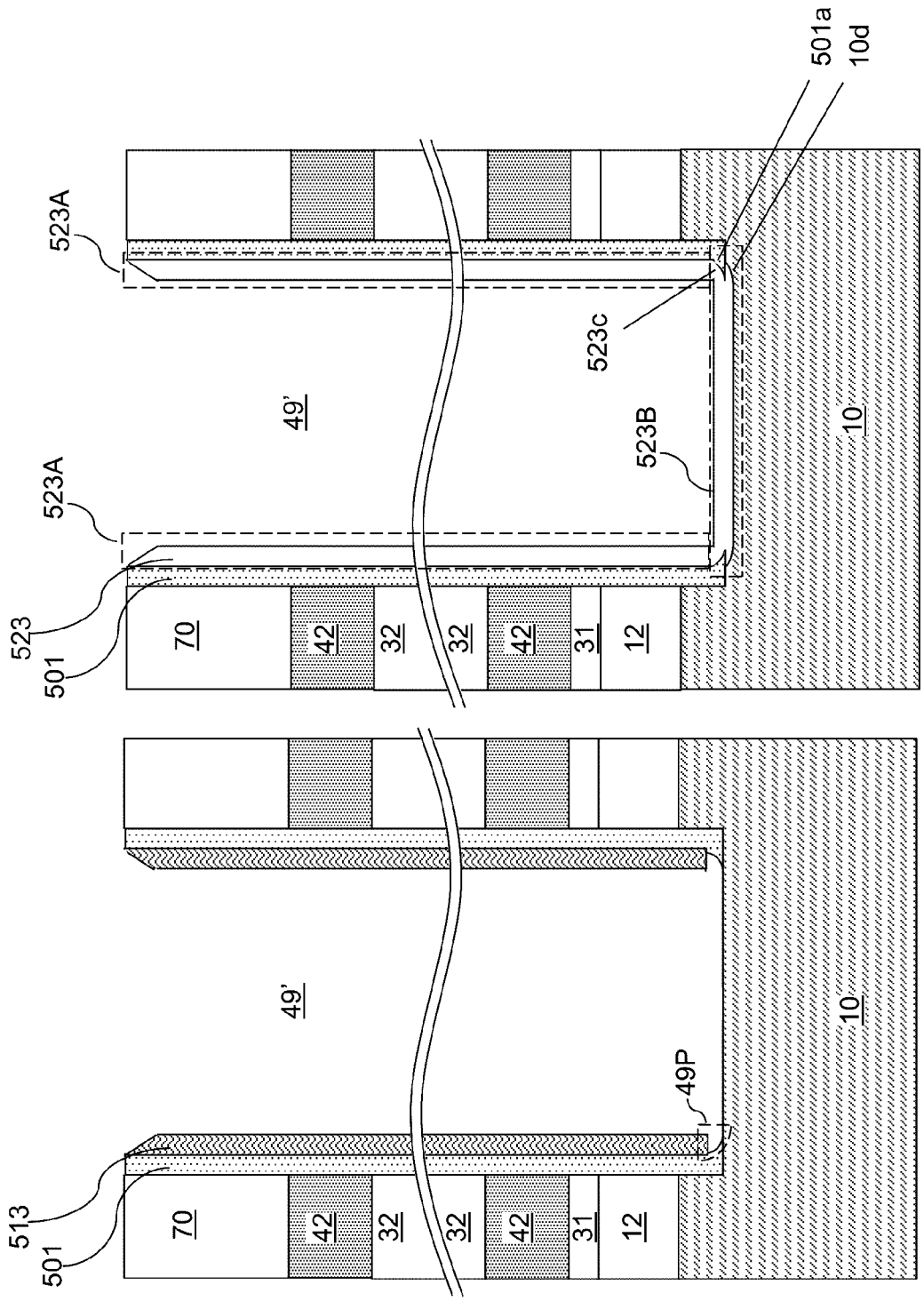

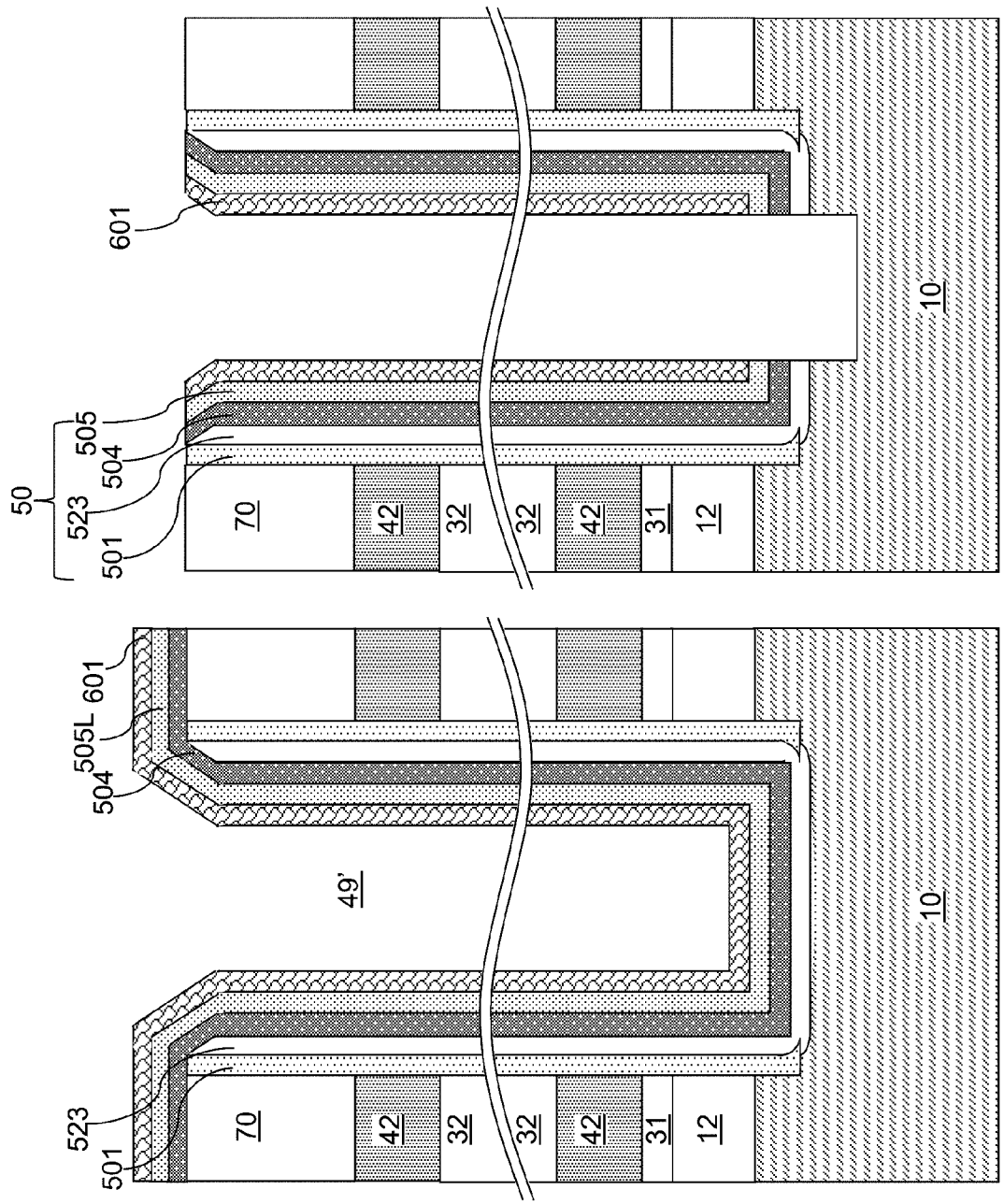

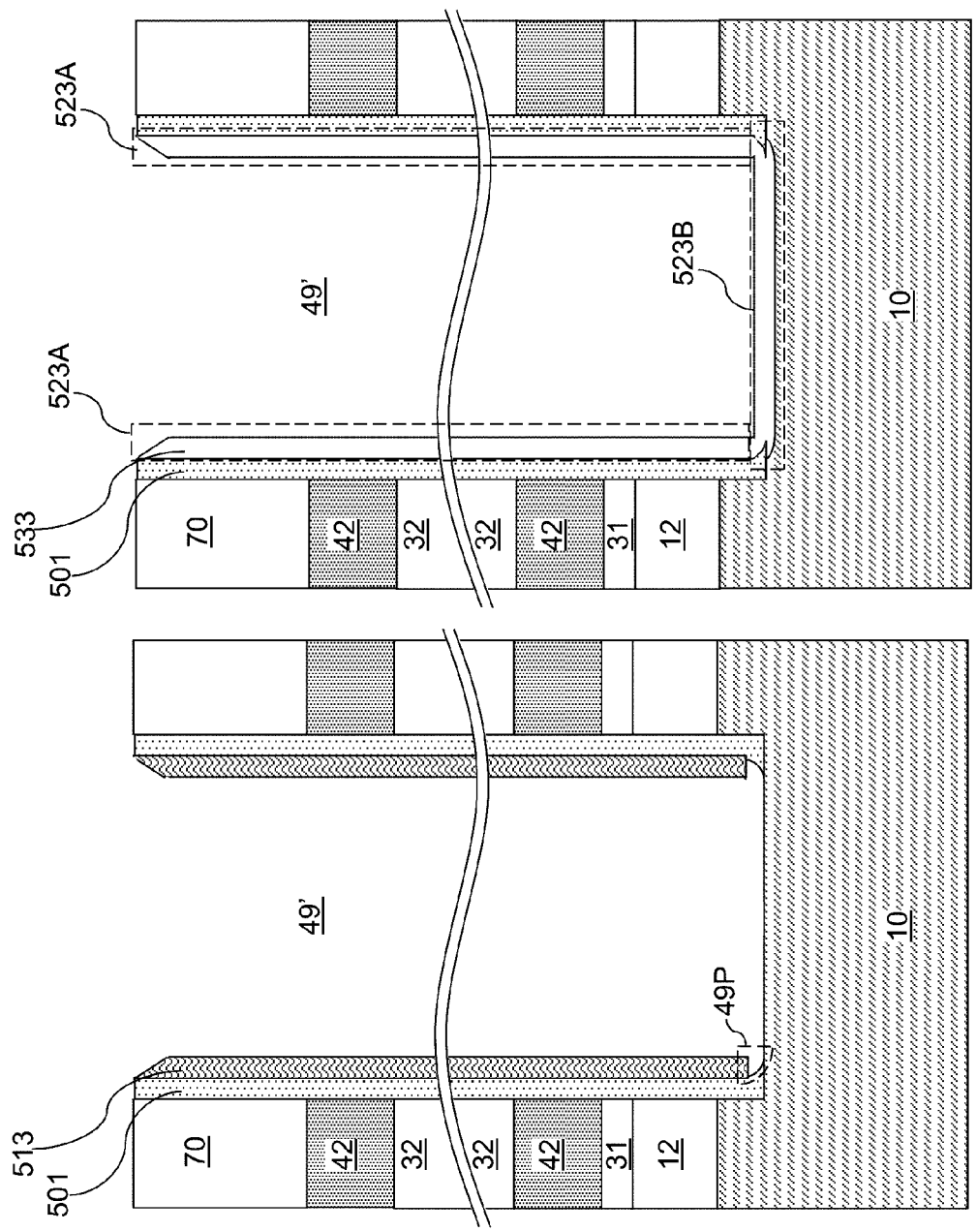

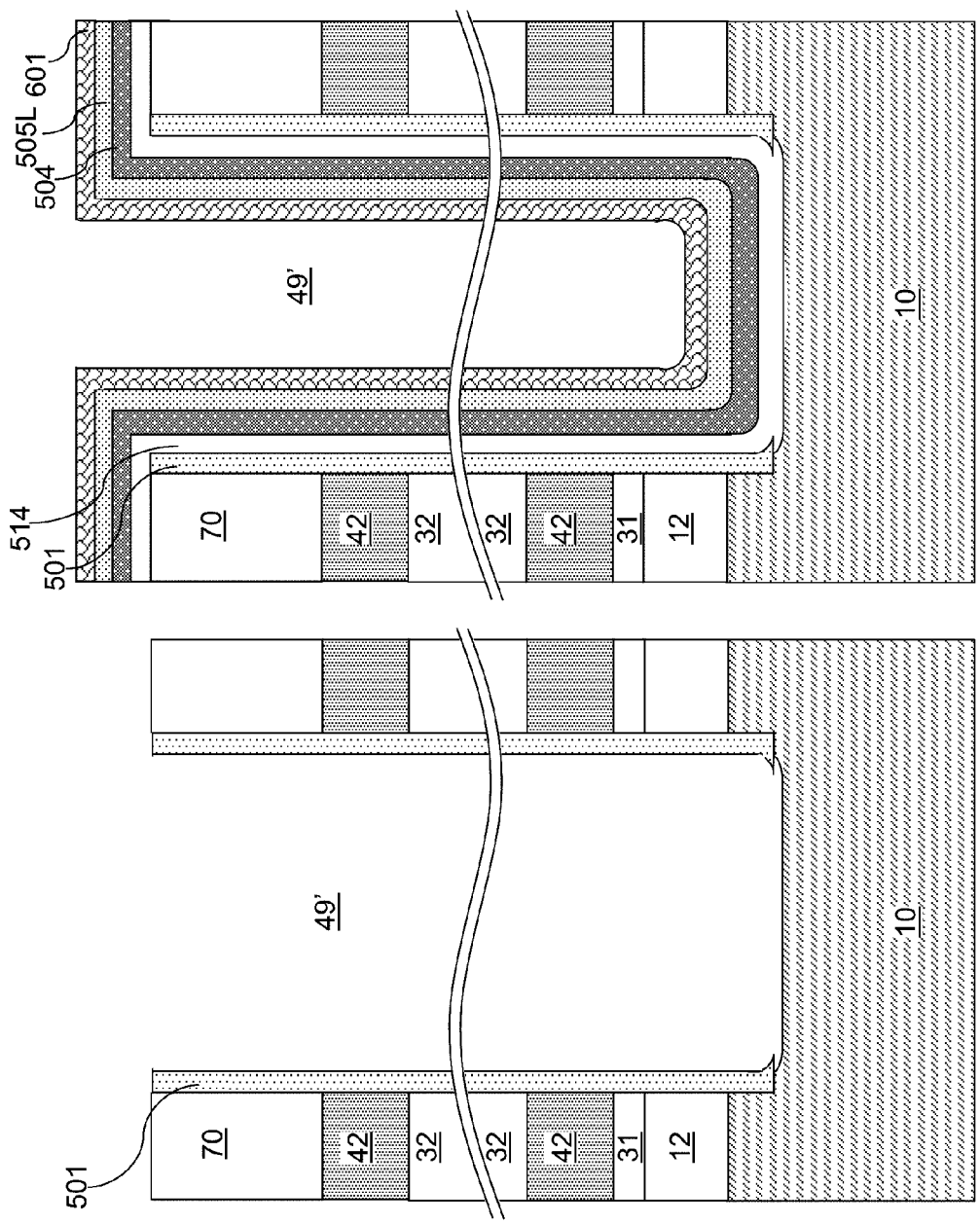

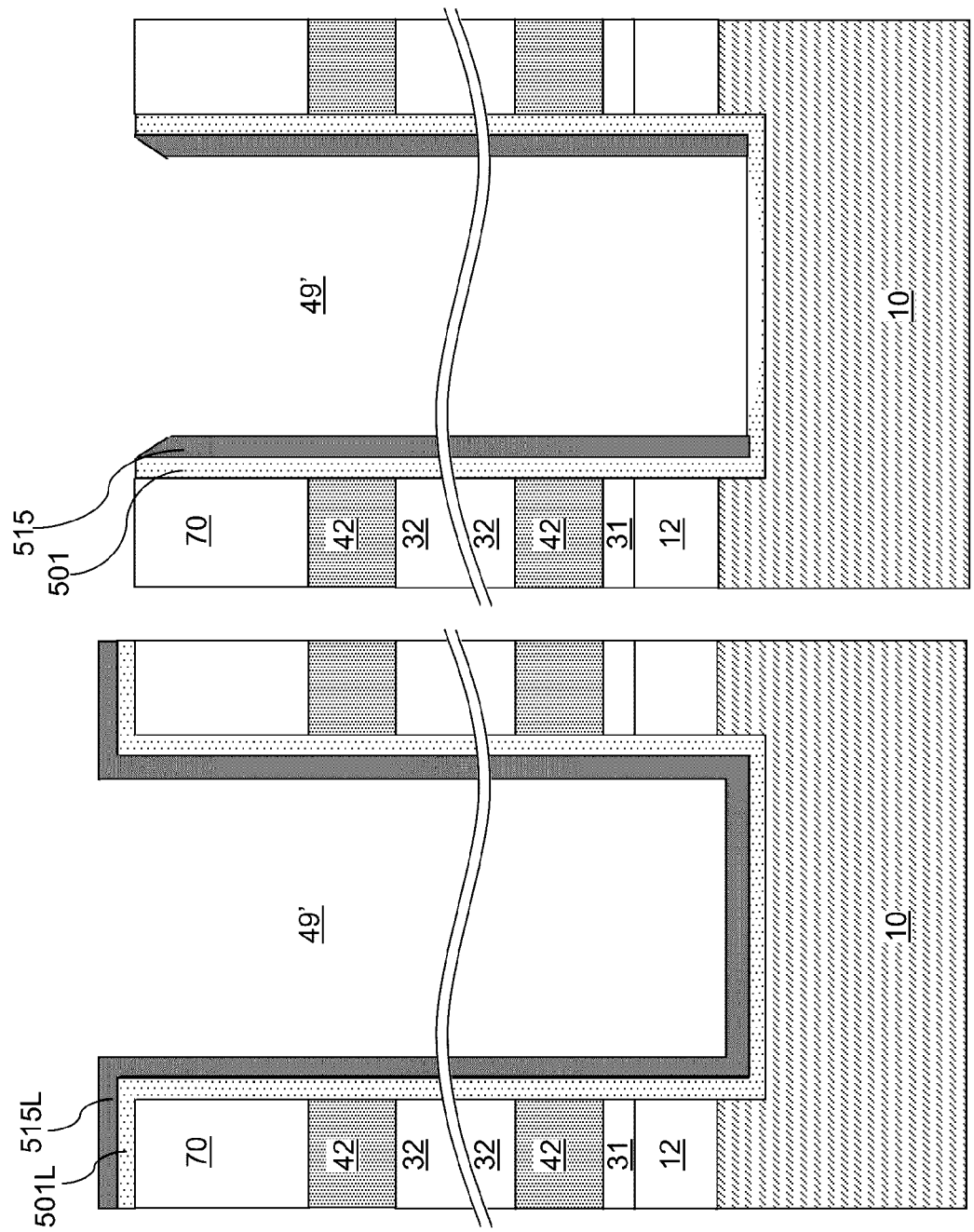

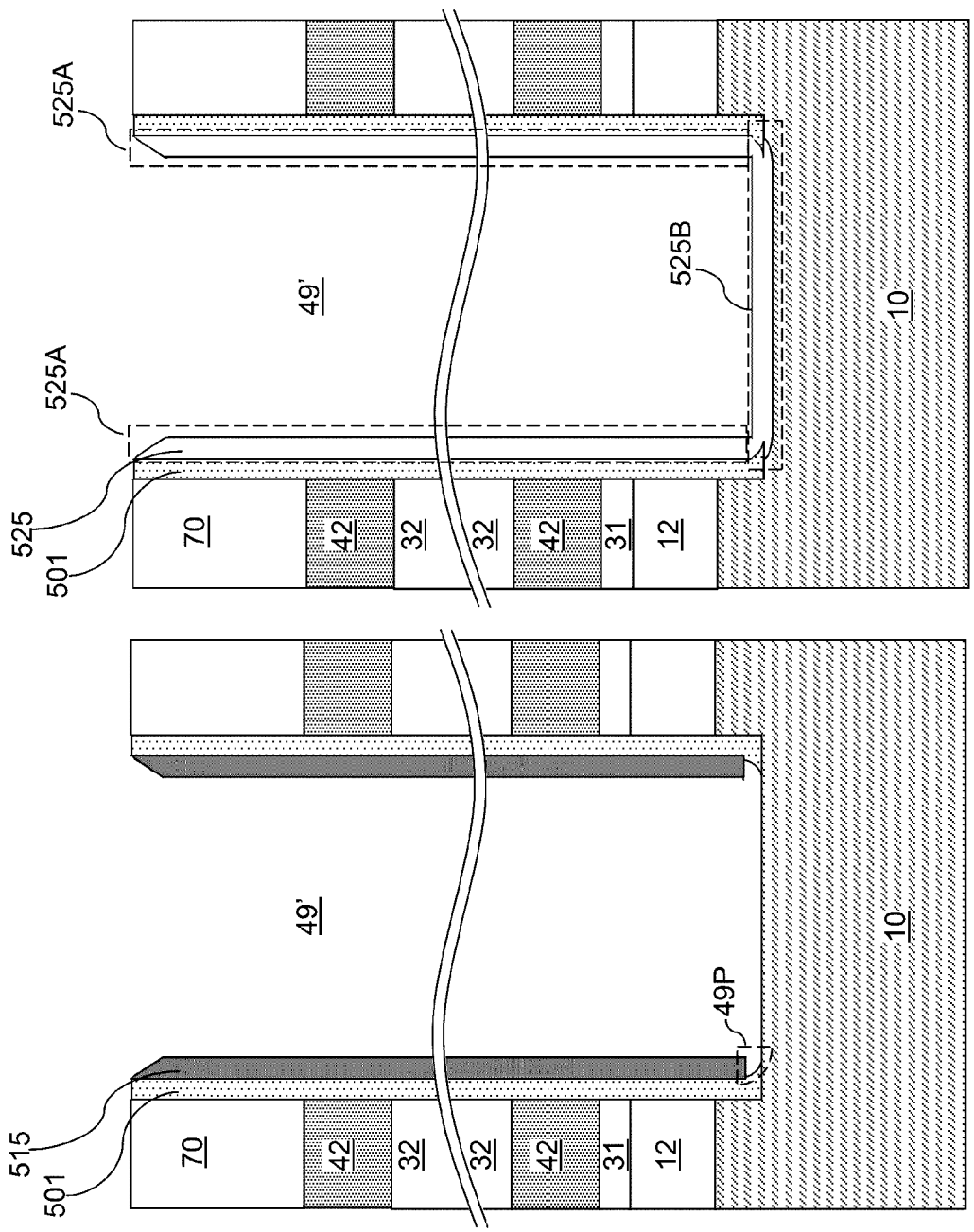

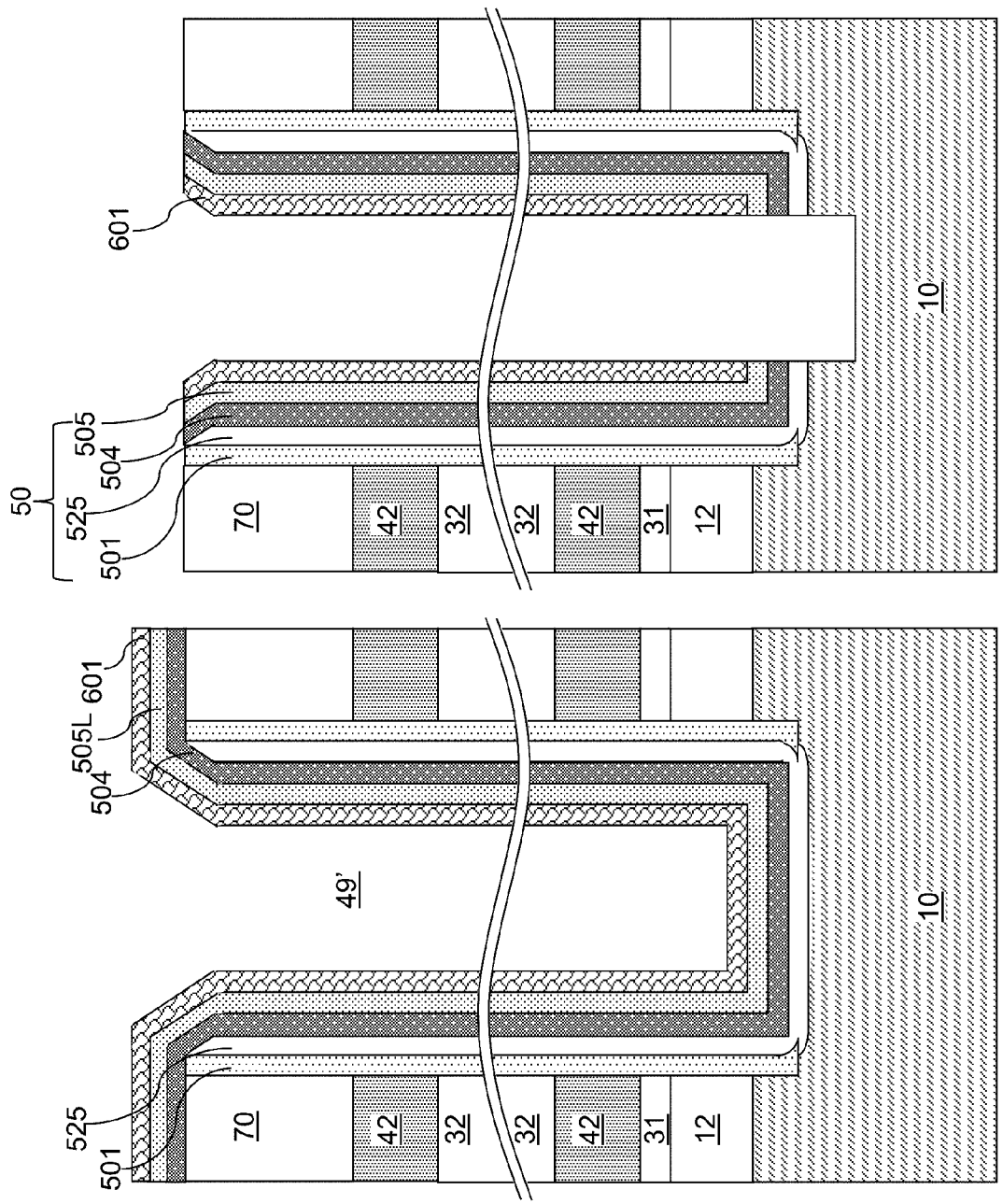

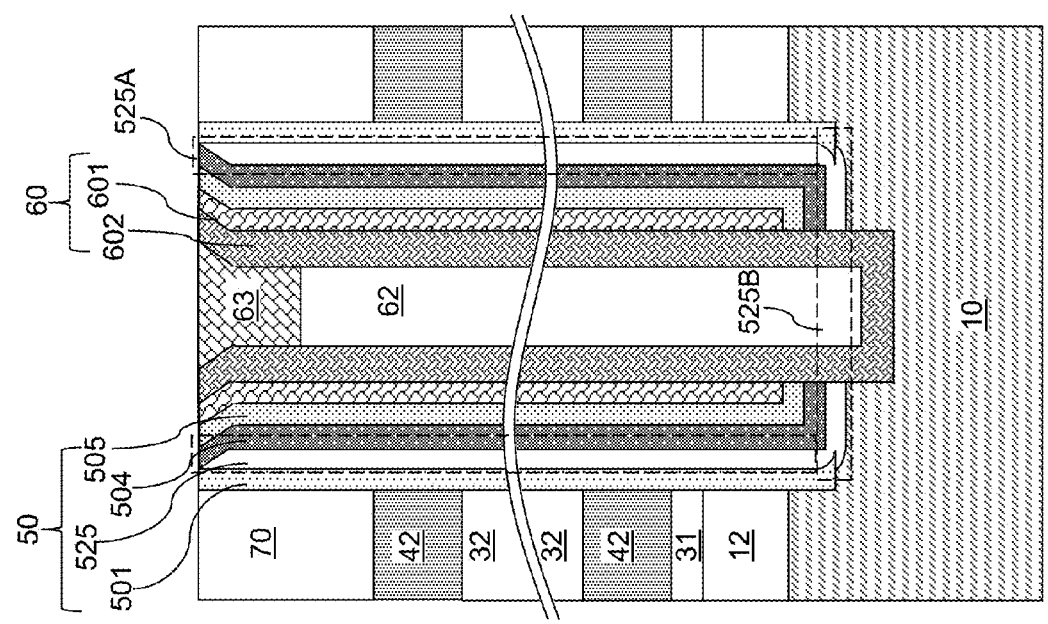

US 9,478,558 B2

SEMICONDUCTOR STRUCTURE WITH CONCAVE BLOCKING DIELECTRIC SIDEWALL AND METHOD OF MAKING THEREOF BY ISOTROPICALLY ETCHING THE BLOCKING DIELECTRIC LAYER

FIELD

The present disclosure relates generally to the field of three-dimensional structures, and specifically to three-dimensional memory structures including memory films, and methods of manufacturing the same.

BACKGROUND

Three-dimensional memory devices can store multiple bits in a single memory stack structure. A memory film is employed in three-dimensional memory devices to store electrical charges. The memory film needs to provide a tunneling path for electrical charges on the front side, and to prevent leakage of stored electrical charges through the backside.

SUMMARY

According to an aspect of the present disclosure, a method of fabricating a memory device is provided. A stack including an alternating plurality of material layers and insulator layers is formed over a substrate. A memory opening extending through the stack is formed. A first blocking dielectric layer is formed in the memory opening and over the stack. A contiguous material layer is formed over the first blocking dielectric layer. A spacer is formed by anisotropically etching the contiguous material layer. A top surface of a horizontal portion of the first blocking dielectric layer is physically exposed within an opening in the spacer. The horizontal portion of the first blocking dielectric layer is etched at a bottom of the memory opening through the opening in the spacer. A top semiconductor surface of the substrate is physically exposed at a bottom of the memory opening. A set of material layers is formed on the top semiconductor surface of the substrate. The set of material layers comprise a memory material layer, a tunneling dielectric layer, and a semiconductor channel.

According to another aspect of the present disclosure, a semiconductor structure is provided, which comprises a stack including an alternating plurality of electrically conductive layers and insulator layers located over a semiconductor substrate, a memory opening extending through the stack, and a first blocking dielectric layer. The first blocking dielectric layer is located in the memory opening, vertically extends contiguously through the alternating plurality of electrically conductive layers and insulator layers, comprises a dielectric metal oxide having a dielectric constant greater than 7.9, and contacts a sidewall of the memory opening and a first surface of the semiconductor substrate. The first blocking dielectric layer comprises a planar bottommost surface and a concave inner sidewall that adjoins an inner periphery of the planar bottommost surface. The semiconductor structure further comprises an additional blocking dielectric layer located inside of the first blocking dielectric layer and contacting at least a portion of an inner sidewall of the first blocking dielectric layer, a memory material layer contacting an inner sidewall of the additional blocking dielectric layer and a top surface of a horizontal portion of the additional blocking dielectric layer, and a semiconductor channel laterally surrounded by the memory material layer and electrically contacting a second surface of the semiconductor substrate.

BRIEF DESCRIPTION OF THE DRAWINGS

FIGS. 2A-2F are sequential vertical cross-sectional views of a memory opening within the exemplary structure during formation of a first exemplary memory stack structure within the memory opening according to a first embodiment of the present disclosure.

FIGS. 3A-3D are sequential vertical cross-sectional views of a memory opening within the exemplary structure during formation of a second exemplary memory stack structure within the memory opening according to a second embodiment of the present disclosure.

FIGS. 4A-4D are sequential vertical cross-sectional views of a memory opening within the exemplary structure during formation of a third exemplary memory stack structure within the memory opening according to a third embodiment of the present disclosure.

FIGS. 5A-5G are sequential vertical cross-sectional views of a memory opening within the exemplary structure during formation of a fourth exemplary memory stack structure within the memory opening according to a fourth embodiment of the present disclosure.

FIGS. 6A-6F are sequential vertical cross-sectional views of a memory opening within the exemplary structure during formation of a fifth exemplary memory stack structure within the memory opening according to a fifth embodiment of the present disclosure.

FIGS. 7A-7G are sequential vertical cross-sectional views of a memory opening within the exemplary structure during formation of a sixth exemplary memory stack structure within the memory opening according to a sixth embodiment of the present disclosure.

DETAILED DESCRIPTION

As discussed above, the present disclosure is directed to three-dimensional memory structures including memory films, and methods of manufacturing the same, the various aspects of which are described below. The embodiments of the disclosure can be employed to form various structures including a multilevel metal interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

Figure 1:
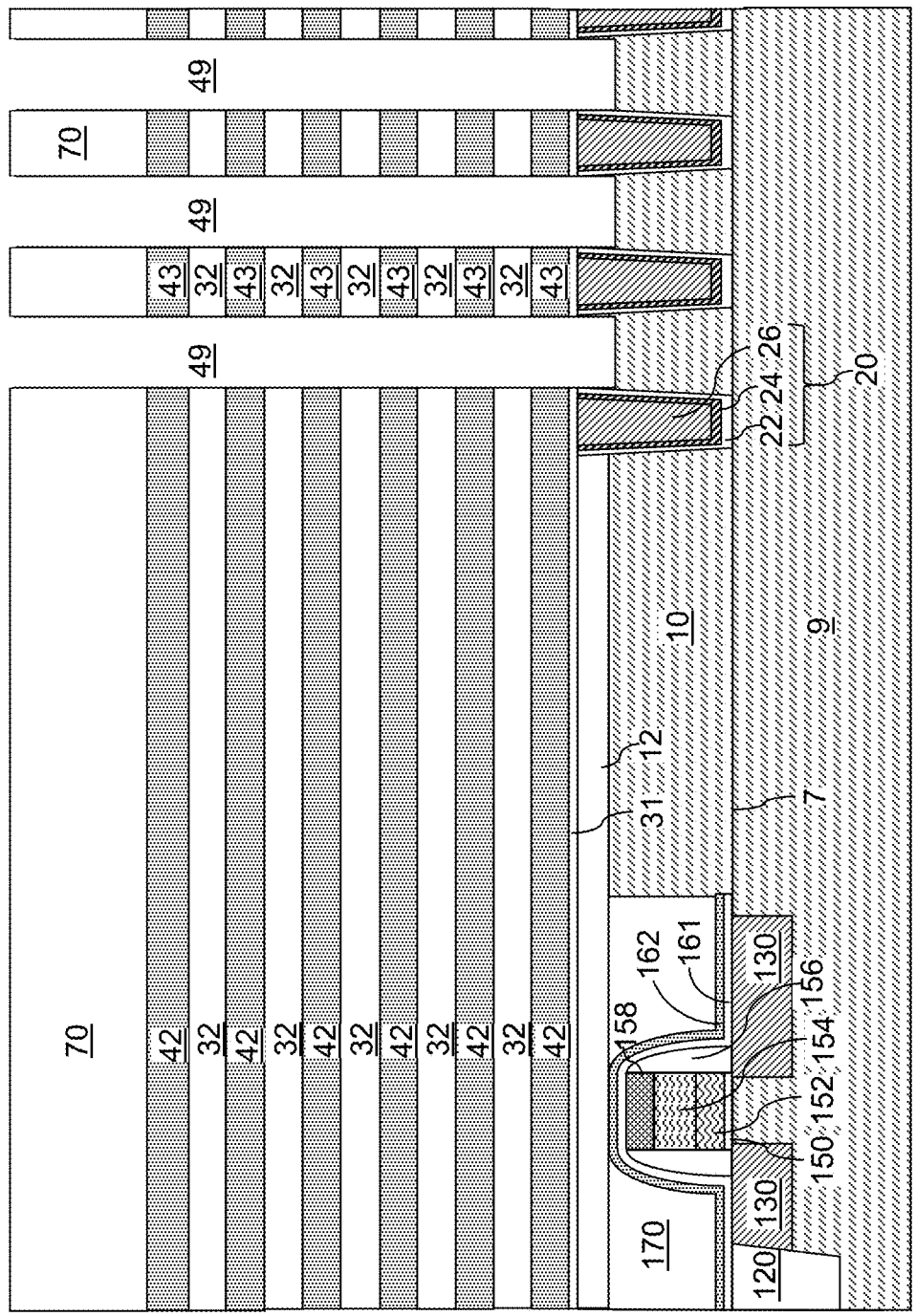
FIG. 1 is a vertical cross-sectional view of an exemplary structure according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. In one embodiment, the substrate can comprise a silicon substrate. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An option semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack including an alternating plurality of first material layers and second material layers can be formed over the substrate (9, 10). For example, the alternating plurality of first material layers and second material layers can be formed on the top surface of the dielectric cap layer 31. In one embodiment, the first material layers can be insulator layers 32, and the stack can include an alternating plurality of insulator layers 32 and material layers (i.e., the second material layers). As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the unrecessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the optional semiconductor material layer 10 can be omitted, and the memory openings 49 can extend to the top surface of the substrate semiconductor layer 9.

A memory stack structure can be formed in each of the memory opening employing various embodiments of the present disclosure. FIGS. 2A-2F illustrate sequential vertical cross-sectional views of a memory opening within the exemplary structure during formation of a first exemplary memory stack structure according to a first embodiment of the present disclosure. Formation of the first exemplary memory stack structure can be performed within each of the memory openings 49 in the exemplary structure illustrated in FIG. 1.

Referring to FIG. 2A, a memory opening 49 is illustrated in a magnified view. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 is herein referred to as first recess depth. The first recess depth can be in a range from 0 nm to 30 nm, although greater recess depths can also be employed. Optionally, the sacrificial material layers 42 can be laterally recessed partially to form lateral recesses (not shown), for example, by an isotropic etch.

A first blocking dielectric layer 501 and a second blocking dielectric layer 503L can be sequentially deposited in each memory opening 49. Each of the first blocking dielectric layer 501 and the second blocking dielectric layer 503L can be a continuous material layer.

In one embodiment, the first blocking dielectric layer 501 can be deposited on the sidewalls of each memory opening 49 by a conformal deposition method. The first blocking dielectric layer 501 includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501 can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501 can be in a range from 1 nm to 6 nm, although lesser and greater thicknesses can also be employed. In one embodiment, the first blocking dielectric layer 501 includes aluminum oxide.

The second blocking dielectric layer 503L is a contiguous material layer that is formed over the first blocking dielectric layer 501. In one embodiment, the second blocking dielectric layer 503L includes a dielectric material that is different from the dielectric material of the first blocking dielectric layer 501. In one embodiment, the dielectric material of the second blocking dielectric layer 503L can be silicon oxide, silicon nitride, or silicon oxynitride. The second blocking dielectric layer 503L can be deposited, for example, by chemical vapor deposition (CVD) or atomic layer deposition (ALD). The thickness of the second blocking dielectric layer 503L can be in a range from 1 nm to 6 nm, although lesser and greater thicknesses can also be employed. In one embodiment, the second blocking dielectric layer 503L includes silicon oxide. A cavity 49' is present within each portion of the memory opening 49 that is not filled with the first and second blocking dielectric layers (501, 503L).

Referring to FIG. 2B, an anisotropic etch can be performed to remove horizontal portions of the second blocking dielectric layer 503L. The chemistry of the anisotropic etch can be selective to the material of the first blocking dielectric layer 501, i.e., not remove the material of the first blocking dielectric layer 501 in any substantial quantity while etching the material of the second blocking dielectric layer 503L. An opening is formed through a horizontal portion of the second blocking dielectric layer 503L at a bottom of the cavity 49' in each memory opening. Each remaining vertical portion of the second blocking dielectric layer 503L within each memory opening constitutes a spacer 503. Each spacer 503 can be homeomorphic to a torus. As used herein, an element is homeomorphic to a geometrical shape if the shape of the element can be mapped to the geometrical shape by continuous deformation without creation or destruction of any hole. A top surface of a horizontal portion of the first blocking dielectric layer 501 is physically exposed at a bottom of the cavity 49' in each memory opening. Each spacer 503 comprises a dielectric material, and contacts an inner sidewall of the first blocking dielectric layer 501.

Referring to FIG. 2C, physically exposed horizontal portions of the first blocking dielectric layer 501 can be selectively etched by an isotropic etch process using the spacer 503 as a mask. The portion of the first blocking dielectric layer 501 overlying the alternating stack (32, 42) can be removed during the isotropic etch process. Further, a horizontal portion of the first blocking dielectric layer 501 at a bottom of the cavity 49' in each memory opening can be etched through the opening in the spacer 503. The spacer 503 is present on the vertical portion of the first blocking dielectric layer 501 within each memory opening during the isotropic etching of physically exposed portions of the first blocking dielectric layer 501. Specifically, a horizontal portion of the first blocking dielectric layer 501 can be etched at a bottom of each memory opening through the opening in the spacer 503. Etching of the horizontal portion of the first blocking dielectric layer 501 forms a peripheral undercut cavity 49P by removing a peripheral portion of the first blocking dielectric layer 501 underneath the spacer 503. The isotropic etch process can be a wet etch process or an isotropic dry etch process. The chemistry of the isotropic etch process can be selected so that the isotropic etch removes the material of the first blocking dielectric layer 501 selective to the material of the spacer 503. The material of the first blocking dielectric layer 501 is etched isotropically during the isotropic etch process. The top surface 503a of the spacer 503 may be sloped and terminate in an outer tip portion which may or may not extend above the top of the stack after removal of the first blocking dielectric 501 depending on the etching conditions. Thus, in some configurations of the embodiments of the present disclosure, the spacers 503 may have an angular profile with a spike portion optionally protruding above the adjacent layers, as shown by the inset in dashed lines in FIG. 2C.

A portion of the first blocking dielectric layer 501 remains within each memory opening. Each remaining first blocking dielectric layer 501 can be topologically homeomorphic to a torus. A concave sidewall 501a surface is formed on the bottommost portion of the inner surface of the first blocking dielectric layer 501 because the material of the first blocking dielectric layer 501 is isotropically removed from a closed shape edge at which the inner surface of the spacer 503 adjoins the bottom surface of the spacer 503. A top semiconductor surface of the substrate (9, 10) is physically exposed at a bottom of each memory opening.

Referring to FIG. 2D, a set (504, 505L, 601) of material layers can be subsequently formed on each physically exposed top semiconductor surface of the substrate (9, 10), on the inner sidewall of each spacer 503, and over the alternating stack (32, 42) and the insulating cap layer 70. In one embodiment, the set of material layers can comprise a memory material layer 504, a tunneling dielectric layer 505L, and an optional first semiconductor channel layer 601.

In one embodiment, the memory material layer 504 can be a charge trapping material including a dielectric charge trapping material, which can be, for example, silicon nitride. Alternatively, the memory material layer 504 can include a conductive material such as doped polysilicon or a metallic material that is patterned into multiple electrically isolated portions (i.e., floating gates), for example, by being formed within lateral recesses (not shown) into sacrificial material layers 42 that may be formed prior to formation of the first blocking dielectric layer 501. In one embodiment, the memory material layer 504 includes a silicon nitride layer.

The memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504 may comprise an insulating charge trapping material, such as one or more silicon nitride segments. Alternatively, the memory material layer 504 may comprise conductive nanoparticles such as metal nanoparticles, which can be, for example, ruthenium nanoparticles. The memory material layer 504 can be formed, for example, by chemical vapor deposition (CVD), atomic layer deposition (ALD), physical vapor deposition (PVD), or any suitable deposition technique for storing electrical charges therein. The thickness of the memory material layer 504 can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed.

The memory material layer 504 can be deposited in, and fill, the peripheral undercut cavity 49P within each memory opening. In one embodiment, a bottommost surface of the memory material layer 504 can be coplanar with a bottom surface of the first blocking dielectric layer 501 within a respective memory opening. In one embodiment, the memory material layer 504 can comprise a charge trapping material or a floating gate material. The bottommost surface of each spacer 503 contacts an annular horizontal surface of the memory material layer 504. Thus, each spacer 503 comprises a dielectric material, contacts an inner sidewall of the first blocking dielectric layer 501 in the same memory opening, and contacts an annular horizontal surface of the memory material layer 504.

Referring to FIG. 2E, the optional first semiconductor channel layer 601, the tunneling dielectric layer 505L, and the memory material layer 504 are sequentially anisotropically etched employing at least one anisotropic etch process. The portions of the first semiconductor channel layer 601, the tunneling dielectric layer 505L, and the memory material layer 504 located above the top surface of the insulating cap layer 70 can be removed by the at least one anisotropic etch process. Further, the portions of the first semiconductor channel layer 601, the tunneling dielectric layer 505L, and the memory material layer 504 at a bottom of each cavity 49' can be removed to form openings in remaining portions thereof. Each of the first semiconductor channel layer 601, the tunneling dielectric layer 505L, and the memory material layer 504 can be etched by anisotropic etch process.

A vertical portion of the first semiconductor channel layer 601 remains in each memory opening. Each remaining portion of the tunneling dielectric layer 505L constitutes a tunneling dielectric 505. A vertical portion of the memory material layer 504 remains in each memory opening. In one embodiment, the memory material layer 504 can be a contiguous layer, i.e., can be a charge storage layer. A surface of the semiconductor material layer 10 (or a top surface of the substrate semiconductor layer 9 in case the semiconductor material layer 10 is not present) can be physically exposed underneath the opening through the first semiconductor channel layer 601, the tunneling dielectric 505, and the memory material layer 504. A tunneling dielectric 505 is embedded within a memory material layer 504. The memory material layer 504 can comprise a charge trapping material or a floating gate material. Within each memory opening, a first blocking dielectric layer 501, a spacer 503, memory material layer 504, and a tunneling dielectric 505 collectively constitutes a memory film 50.

In one embodiment, the first semiconductor channel layer 601, the tunneling dielectric 505, and the memory material layer 504 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2F, a second semiconductor channel layer 602 can be deposited directly on the semiconductor surface of the semiconductor material layer 10 in the substrate (9, 10), and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

In case the cavity 49' in each memory opening is not completely filled by the second semiconductor channel layer 602, a dielectric material can be deposited in the cavity 49' to fill any remaining portion of the cavity 49' within each memory opening. The dielectric material can be deposited by a conformal deposition method such as low pressure chemical vapor deposition (LPCVD), or by a self-planarizing deposition process such as spin coating. Portions of the dielectric material deposited above the top surface of the insulating cap layer 70 can be removed by a recess etch or a planarization process. Further, the remaining portion of the deposited dielectric material after the planarization process can be vertically recessed below the top surface of the insulating cap layer 70 by a recess etch. The remaining portion of the dielectric material after the recess process constitutes a dielectric core 62. The dielectric core 62 includes a dielectric material such as silicon oxide or organosilicate glass.

The horizontal portion of the second semiconductor channel layer 602 located above the top surface of the insulating cap layer 70 can be removed by a planarization process, which can employ a recess etch or chemical mechanical planarization (CMP). A vertical portion of the second semiconductor channel layer 602 remains within each memory opening.

Each adjoining pair of a first semiconductor channel layer 601 and a second semiconductor channel layer 602 collectively constitute a semiconductor channel 60 through which electrical current can flow when a vertical NAND device including the semiconductor channel 60 is turned on. A tunneling dielectric 505 is embedded within each memory material layer 504, and laterally surrounds a portion of the semiconductor channel 60. Each memory film 50 can store electrical charges with a macroscopic retention time. As used herein, a macroscopic retention time refers to a retention time suitable for operation of a memory device as a permanent memory device such as a retention time in excess of 24 hours.

Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Within each memory opening, the bottommost surface of the first blocking dielectric layer 501 contacts a surface of the substrate (9, 10), which is herein referred to as a first surface 10a of the substrate (9, 10). The semiconductor channel 60 contacts another surface of the substrate (9, 10), which is herein referred to as a second surface 10b of the substrate (9, 10). Further, the memory material layer 504 contacts a surface of the semiconductor substrate (9, 10), which is herein referred to as third surface 10c of the semiconductor substrate (9, 10). An outer periphery of the third surface adjoins the first surface, and an inner periphery of the third surface adjoins the second surface.

The structure of FIG. 2F is a first exemplary memory stack structure, which comprises a first blocking dielectric layer 501 vertically extending at least from a bottommost layer (e.g., the bottommost sacrificial material layer 42) of the stack (32, 42) to a topmost layer (e.g., the topmost sacrificial material layer 42) of the stack, comprising a dielectric metal oxide having a dielectric constant greater than 7.9, and contacting a sidewall of the memory opening and a first surface of the semiconductor substrate (9, 10). The first blocking dielectric layer 501 comprises a planar bottommost surface and a concave inner sidewall 501a that adjoins an inner periphery of the planar bottommost surface. In case the spacer 503 comprises a dielectric material, the spacer 503 can be an additional blocking dielectric layer located inside of the first blocking dielectric layer 501 and contacting at least a portion of an inner sidewall of the first blocking dielectric layer 501. A memory material layer 504 contacts an inner sidewall of the additional blocking dielectric layer (i.e., the spacer 503) and a top surface of a horizontal portion of the additional blocking dielectric layer (i.e., the spacer 503). A semiconductor channel 60 is laterally surrounded by the memory material layer 504 and contacts a second surface of the semiconductor substrate (9, 10).

FIGS. 3A-3D illustrate sequential vertical cross-sectional views of a memory opening within the exemplary structure during formation of a second exemplary memory stack structure within the memory opening according to a second embodiment of the present disclosure. The second exemplary memory stack structure of FIG. 3A can be derived from the first exemplary memory stack structure illustrated in FIG. 2C by depositing an additional blocking dielectric layer 507 directly on the substrate (9, 10) and in the peripheral undercut cavity 49P (See FIG. 2C) prior to forming the set (504, 505L, 601; See FIG. 2D) of material layers.

The additional blocking dielectric layer 507 can be formed by conformal deposition of a dielectric material such as silicon oxide, silicon oxynitride, silicon nitride, or a high-k dielectric metal oxide. The additional blocking dielectric layer 507 can include the same material as, or a different material from, the material of the spacer 503. In one embodiment, the additional blocking dielectric layer 507 can be a silicon oxide layer. The additional blocking dielectric layer 507 can be deposited, for example, by chemical vapor deposition or atomic layer deposition. The additional blocking dielectric layer 507 is deposited on an inner sidewall of the spacer 503. The peripheral undercut cavity 49P (See FIG. 2C) within each memory opening can be filled with the additional blocking dielectric layer 507. In one embodiment, a bottommost surface of the additional blocking dielectric layer 507 can be located within a horizontal plane including the bottommost surface of the first blocking dielectric layer 501.

Referring to FIG. 3B, the processing steps of FIG. 2D are performed to deposit a set of material layers including, for example, a memory material layer 504, a tunneling dielectric layer 505L, and an optional first semiconductor channel layer 601.

Referring to FIG. 3C, the processing steps of FIG. 2E are performed to remove horizontal portion of the optional first semiconductor channel layer 601, the tunneling dielectric layer 505L, and the memory material layer 504 employing at least one anisotropic etch process. Further, horizontal portions of the additional blocking dielectric layer 507 are removed by the at least one anisotropic etch, and each portion of the semiconductor substrate (9, 10) underlying a cavity 49' can be vertically recessed. Within each memory opening, a memory film 50 is formed, which comprises, from outside to inside, a first blocking dielectric layer 501, a spacer 503 (which is a second blocking dielectric layer), an additional blocking dielectric layer 507, a memory material layer 504, and a tunneling dielectric 505.

Referring to FIG. 3D, the processing steps of FIG. 2F can be performed to form a semiconductor channel 60, a dielectric core 62, and a drain region 63. The first blocking dielectric layer 501 contacts a first surface of the semiconductor substrate (9, 10). The first surface of the semiconductor substrate (9, 10) can contact an annular bottom surface of the first blocking dielectric layer 501. The semiconductor channel contacts a second surface of the semiconductor substrate (9, 10), which can include a substantially vertical sidewall and a horizontal semiconductor surface adjoining a bottom periphery of the vertical sidewall. The additional blocking dielectric layer 507 can have a homogeneous material composition throughout the entirety thereof. The additional blocking dielectric layer 507 contacts a third surface of the semiconductor substrate (9, 10). An outer periphery of the third surface adjoins the first surface, and an inner periphery of the third surface adjoins the second surface. The spacer 503 comprises a dielectric material, contacts an inner sidewall of the first blocking dielectric layer 501, and contacts an outer sidewall of the additional blocking dielectric layer 507.

The second exemplary memory stack structure comprises a first blocking dielectric layer 501 vertically extending at least from the bottommost layer of the stack (32, 42) to a topmost layer of the stack, comprising a dielectric metal oxide having a dielectric constant greater than 7.9, and contacting a sidewall of the memory opening and a first surface of the semiconductor substrate (9, 10). The first blocking dielectric layer 501 comprises a planar bottommost surface and a concave inner sidewall that adjoins an inner periphery of the planar bottommost surface. The additional blocking dielectric layer 507 is located inside of the first blocking dielectric layer 501, and contacts at least a portion of an inner sidewall of the first blocking dielectric layer 501, which is the concave portion of the inner sidewall of the first blocking dielectric layer 501. The memory material layer 504 contacts an inner sidewall of the additional blocking dielectric layer 507 and a top surface of a horizontal portion of the additional blocking dielectric layer 507. The semiconductor channel 60 is laterally surrounded by the memory material layer 504 and contacts a second surface of the semiconductor substrate (9, 10). The additional blocking dielectric layer 507 contacts a third surface of the semiconductor substrate (9, 10). The third surface comprises a horizontal surface that is coplanar with the first surface of the semiconductor substrate (9, 10) that contacts the bottommost surface of the first blocking dielectric layer 501. Further, the inner periphery of the third surface is adjoined to an upper periphery of a sidewall of the second surface of the semiconductor substrate (9, 10), which is in contact with the semiconductor channel 60.

Referring to FIGS. 4A-4D, sequential vertical cross-sectional views of a memory opening within the exemplary structure are shown during formation of a third exemplary memory stack structure within the memory opening according to a third embodiment of the present disclosure. The third exemplary memory stack structure of FIG. 4A can be derived from the first exemplary memory stack structure illustrated in FIG. 2C by removing the spacer 503 selective to the first blocking dielectric layer 501 and the semiconductor material of the semiconductor material layer 10 (or the semiconductor material directly underneath the cavity 49'). Optionally, an anneal may be performed prior to removal of the spacer 503 to crystallize the dielectric material of the first blocking dielectric layer 501. For example, the first blocking dielectric layer 501 may be deposited in an amorphous form (for example, as amorphous aluminum oxide), and may be annealed to form a crystalline high-k dielectric metal oxide prior to removal of the spacer 503. The spacer 503 can be removed employing an isotropic etch process that is selective to the dielectric material of the first blocking dielectric layer 501.

Referring to FIG. 4B, an additional blocking dielectric layer 507 and a set (504, 505L, 601) of material layers can be subsequently formed on each physically exposed top semiconductor surface of the substrate (9, 10), on each sidewalls of the first blocking dielectric layer 501, and over the alternating stack (32, 42) and the insulating cap layer 70. In one embodiment, the set of material layers can comprise a memory material layer 504, a tunneling dielectric layer 505L, and an optional first semiconductor channel layer 601.

The additional blocking dielectric layer 507 can be deposited on a sidewall of the first blocking dielectric layer 501 and the top semiconductor surface of the substrate (9, 10). In one embodiment, the bottommost surface of the additional blocking dielectric layer 507 can be formed within a horizontal plane including the bottommost surface of the first blocking dielectric layer 501. In one embodiment, the additional blocking dielectric layer 507 can be formed by conformal deposition of a dielectric material. The additional blocking dielectric layer 507 can have the same composition and thickness as in the second embodiment. The processing steps of FIG. 2D can be performed to form the set (504, 505L, 601) of material layers.

Referring to FIG. 4C, the processing steps of FIG. 2E are performed to remove horizontal portion of the optional first semiconductor channel layer 601, the tunneling dielectric layer 505L, and the memory material layer 504 employing at least one anisotropic etch process. Further, horizontal portions of the additional blocking dielectric layer 507 are removed by the at least one anisotropic etch, and each portion of the semiconductor substrate (9, 10) underlying a cavity 49' can be vertically recessed. Within each memory opening, a memory film 50 is formed, which comprises, from outside to inside, a first blocking dielectric layer 501, an additional blocking dielectric layer 507, a memory material layer 504, and a tunneling dielectric 505.

Referring to FIG. 4D, the processing steps of FIG. 2F can be performed to form a semiconductor channel 60, a dielectric core 62, and a drain region 63. The first blocking dielectric layer 501 contacts a first surface of the semiconductor substrate (9, 10). The first surface of the semiconductor substrate (9, 10) can contact an annular bottom surface of the first blocking dielectric layer 501. The semiconductor channel contacts a second surface of the semiconductor substrate (9, 10), which can include a substantially vertical sidewall and a horizontal semiconductor surface adjoining a bottom periphery of the vertical sidewall. The additional blocking dielectric layer 507 can have a homogeneous material composition throughout the entirety thereof. The additional blocking dielectric layer 507 contacts a third surface of the semiconductor substrate (9, 10). An outer periphery of the third surface adjoins the first surface, and an inner periphery of the third surface adjoins the second surface.

The third exemplary memory stack structure comprises a first blocking dielectric layer 501 vertically extending at least from the bottommost layer of the stack (32, 42) to a topmost layer of the stack, comprising a dielectric metal oxide having a dielectric constant greater than 7.9, and contacting a sidewall of the memory opening and a first surface of the semiconductor substrate (9, 10). The first blocking dielectric layer 501 comprises a planar bottommost surface and a concave inner sidewall that adjoins an inner periphery of the planar bottommost surface. The additional blocking dielectric layer 507 is located inside of the first blocking dielectric layer 501, and contacts at least a portion of an inner sidewall of the first blocking dielectric layer 501, which comprises the concave portion of the inner sidewall of the first blocking dielectric layer 501 and a vertical portion of the inner sidewall of the first blocking dielectric layer 501. The memory material layer 504 contacts an inner sidewall of the additional blocking dielectric layer 507 and a top surface of a horizontal portion of the additional blocking dielectric layer 507. The semiconductor channel 60 is laterally surrounded by the memory material layer 504 and contacts a second surface of the semiconductor substrate (9, 10). The additional blocking dielectric layer 507 contacts a third surface of the semiconductor substrate (9, 10). The third surface comprises a horizontal surface that is coplanar with the first surface of the semiconductor substrate (9, 10) that contacts the bottommost surface of the first blocking dielectric layer 501. Further, the inner periphery of the third surface is adjoined to an upper periphery of a sidewall of the second surface of the semiconductor substrate (9, 10), which is in contact with the semiconductor channel 60. The additional blocking dielectric layer 507 can contact the entirety of an inner sidewall of the first blocking dielectric layer 501.

Referring to FIGS. 5A-5F, sequential vertical cross-sectional views of a memory opening within the exemplary structure are shown during formation of a fourth exemplary memory stack structure within the memory opening according to a fourth embodiment of the present disclosure. The fourth exemplary memory stack structure of FIG. 5A can be formed by depositing a stack of a first blocking dielectric layer 501 and a semiconductor material layer 513L into a memory opening 49 provided in the exemplary structure of FIG. 1. The first blocking dielectric layer 501 can have the same composition and thickness as in the first through third embodiments. The semiconductor material layer 513L comprises a semiconductor material that may be converted into a dielectric material by oxidation, nitridation, or a combination thereof. For example, the semiconductor material layer 513L can include silicon, a silicon-germanium alloy, and/or a silicon-carbon alloy that can be converted into silicon oxide, silicon nitride, silicon oxynitride, an oxide of an alloy of silicon and at least one of germanium and carbon, a nitride of an alloy of silicon and at least one of germanium and carbon, or an oxynitride of an alloy of silicon and at least one of germanium and carbon. The semiconductor material layer 513L can be deposited by a conformal deposition method such as chemical vapor deposition or atomic layer deposition. The thickness of the semiconductor material layer 513L can be in a range from 0.6 nm to 6 nm, although lesser and greater thicknesses can also be employed.

Referring to FIG. 5B, an anisotropic etch can be performed to remove horizontal portions of the semiconductor material layer 513L. The chemistry of the anisotropic etch can be selective to the material of the first blocking dielectric layer 501, i.e., not remove the material of the first blocking dielectric layer 501 in any substantial quantity while etching the material of the semiconductor material layer 513L. An opening is formed through a horizontal portion of semiconductor material layer 513L at a bottom of the cavity 49' in each memory opening. Each remaining vertical portion of the semiconductor material layer 513L within each memory opening constitutes a spacer 513. Each spacer 513 can be homeomorphic to a torus. A top surface of a horizontal portion of the first blocking dielectric layer 501 is physically exposed at a bottom of the cavity 49' in each memory opening. Each spacer 513 comprises a semiconductor material, and contacts an inner sidewall of the first blocking dielectric layer 501.

Referring to FIG. 5C, physically exposed horizontal portions of the first blocking dielectric layer 501 can be selectively etched by an isotropic etch process using the spacer 513 as a mask. The portion of the first blocking dielectric layer 501 overlying the alternating stack (32, 42) can be removed during the isotropic etch process. Further, a horizontal portion of the first blocking dielectric layer 501 at a bottom of the cavity 49' in each memory opening can be etched through the opening in the spacer 513. The spacer 513 is present on the vertical portion of the first blocking dielectric layer 501 within each memory opening during the isotropic etching of physically exposed portions of the first blocking dielectric layer 501. Specifically, a horizontal portion of the first blocking dielectric layer 501 can be etched at a bottom of each memory opening through the opening in the spacer 513. Etching of the horizontal portion of the first blocking dielectric layer 501 forms a peripheral undercut cavity 49P by removing a peripheral portion of the first blocking dielectric layer 501 underneath the spacer 513. The isotropic etch process can be a wet etch process or an isotropic dry etch process. The chemistry of the isotropic etch process can be selected so that the isotropic etch removes the material of the first blocking dielectric layer 501 selective to the material of the spacer 513. The material of the first blocking dielectric layer 501 is etched isotropically during the isotropic etch process. A top semiconductor surface of the substrate (9, 10) is physically exposed at the bottom of each memory opening.

A portion of the first blocking dielectric layer 501 remains within each memory opening. Each remaining first blocking dielectric layer 501 can be topologically homeomorphic to a torus. A concave surface is formed on the bottommost portion of the inner surface of the first blocking dielectric layer 501 because the material of the first blocking dielectric layer 501 is isotropically removed from a closed shape edge at which the inner surface of the spacer 503 adjoins the bottom surface of the spacer 513. A top semiconductor surface of the substrate (9, 10) is physically exposed at a bottom of each memory opening.

Referring to FIG. 5D, an additional blocking dielectric layer 523 can be formed directly on the substrate (9, 10) and on the inner sidewall of the first blocking dielectric layer 501 by simultaneous conversion of the spacer 513 into a first dielectric material portion 523A and a surface portion of the substrate (9, 10) located directly underneath the cavity 49' into a second dielectric material portion 523B. The conversion process can comprise a thermal oxidation process, a plasma oxidation process, a thermal nitridation process, a plasma nitridation process, a thermal oxynitridation process, and/or a plasma oxynitridation process. The first dielectric material portion 523A comprises a dielectric compound of the semiconductor material of the spacer 513 and at least one element selected from oxygen and nitrogen. In one embodiment, the first dielectric material portion 523A can comprise a dielectric oxide of at least one semiconductor element, a dielectric nitride of at least one semiconductor element, and/or a dielectric oxynitride of at least one semiconductor element. In one embodiment, the first dielectric material portion 523A can comprise a dielectric oxide including a compound of at least one semiconductor element in the semiconductor material of the spacer 513 and oxygen. For example, if the spacer 513 is a silicon spacer (e.g., polysilicon or amorphous silicon), and the substrate 10 is a silicon substrate then portions 523A and 523B both comprise silicon oxide.

The duration of the conversion process can be selected such that the outer periphery of the first dielectric material portion 523A is adjoined to an inner periphery of a bottom portion of the second dielectric material portion 523B. Thus, the additional blocking dielectric layer 523 can be formed as an integral structure, i.e., a structure consisting of a single contiguous region. The first dielectric material portion 523A and the second dielectric material portion 523B can have the same material composition if the semiconductor material of the spacer 513 has the same composition as the semiconductor material of the semiconductor material layer 10, or can have different material compositions if the semiconductor material of the spacer 513 has a different composition than the semiconductor material of the semiconductor material layer 10.

The additional blocking dielectric layer 523 can be formed in, and fill, the peripheral undercut cavity 49P within each memory opening. In one embodiment, a bottommost surface of the additional blocking dielectric layer 523 can be further recessed than the bottom surface of the first blocking dielectric layer 501 within a respective memory opening. A convex surface 523c of the additional blocking dielectric layer 523 contacts a concave sidewall 501a surface of the first blocking dielectric layer 501. Further, another convex surface of the additional blocking dielectric layer 523 contacts a concave surface 10d of the semiconductor substrate (9, 10).

Referring to FIG. 5E, a set (504, 505L, 601) of material layers can be subsequently formed on the inner sidewall and the top surface of the additional blocking dielectric layer 523 and over the alternating stack (32, 42) and the insulating cap layer 70. In one embodiment, the set of material layers can comprise a memory material layer 504, a tunneling dielectric layer 505L, and an optional first semiconductor channel layer 601. The same processing steps can be employed to form the set (504, 505L, 601) of material layers as in the first embodiment.

Referring to FIG. 5F, the processing steps of FIG. 2E can be performed to form a memory film 50, which includes the first blocking dielectric layer 501, the additional blocking dielectric layer 523, the memory material layer 504, and the tunneling dielectric 505.

Figure 5G:
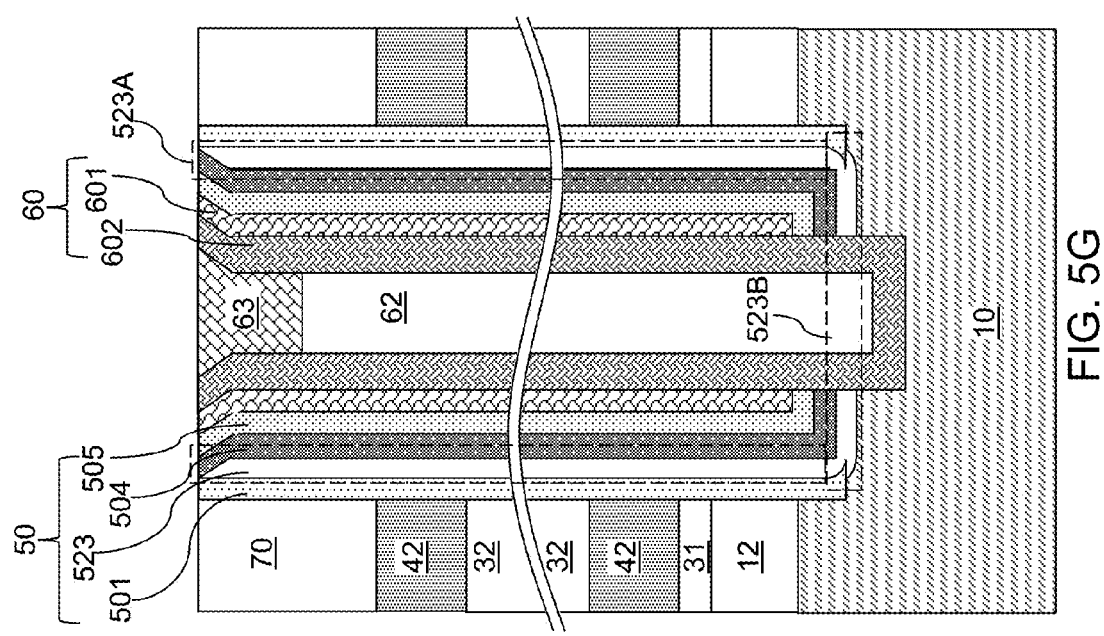

Referring to FIG. 5G, a semiconductor channel 60 including a first semiconductor channel layer 601 and a second semiconductor channel layer can be formed as in the first embodiment. Further, a dielectric core 62 and a drain region 63 can be formed as in the first embodiment.

The structure of FIG. 5G is a fourth exemplary memory stack structure, which comprises a first blocking dielectric layer 501 vertically extending at least from a bottommost layer (e.g., the bottommost sacrificial material layer 42) of the stack (32, 42) to a topmost layer (e.g., the topmost sacrificial material layer 42) of the stack, comprising a dielectric metal oxide having a dielectric constant greater than 7.9, and contacting a sidewall of the memory opening and a first surface of the semiconductor substrate (9, 10). The first blocking dielectric layer 501 comprises a planar bottommost surface and a concave inner sidewall that adjoins an inner periphery of the planar bottommost surface. The additional blocking dielectric layer 523 is located inside of the first blocking dielectric layer 501 and contacts at least a portion of an inner sidewall of the first blocking dielectric layer 501. A memory material layer 504 contacts an inner sidewall of the additional blocking dielectric layer 523 and a top surface of a horizontal portion of the additional blocking dielectric layer 523. A semiconductor channel 60 is laterally surrounded by the memory material layer 504 and contacts a second surface of the semiconductor substrate (9, 10).

The additional blocking dielectric layer 523 can have a first dielectric material portion 523A having a first composition and a second dielectric material portion 523B having a second composition that is the same as or different from the first composition. A bottom surface of the second dielectric material portion 523B can be located below the horizontal plane including the bottom surface of the first blocking dielectric layer 501, and the top surface of the second dielectric material portion 523B can be located above the horizontal plane including the bottom surface of the first blocking dielectric layer 501. The tip of the horizontal portion of the first blocking dielectric layer 501 protrudes into the sidewall of the horizontal part of the additional blocking dielectric layer 523 between the portions 523A and 523B. The additional blocking dielectric layer 523 can contact a third surface of the semiconductor substrate (9, 10). The outer periphery of the third surface adjoins the first surface and the inner periphery of the third surface adjoins the second surface.

Referring to FIGS. 6A-6F, sequential vertical cross-sectional views of a memory opening within the exemplary structure are shown during formation of a fifth exemplary memory stack structure within the memory opening according to a fifth embodiment of the present disclosure. The fifth exemplary memory stack structure of FIG. 6A can be the same as the fourth exemplary memory stack structure of FIG. 5C.

Referring to FIG. 6B, the processing steps of FIG. 5D can be performed to form a disposable dielectric layer 533. The disposable dielectric layer 533 of the fifth embodiment can be identical to the additional blocking dielectric layer 523 of the fourth embodiment except that the disposable dielectric layer 533 is formed as a disposable (e.g., sacrificial) structure, i.e., a temporary structure to be subsequently removed. Thus, the disposable dielectric layer 533 can be formed by simultaneously converting the spacer 513 into a first dielectric material portion 523A and a surface portion of the substrate (9, 10) located underneath the top semiconductor surface of the substrate (9, 10) directly underneath a cavity 49' into a second dielectric material portion 523B. The disposable dielectric layer 533 comprises the first dielectric material portion 523A and the second dielectric material portion 523B.

Referring to FIG. 6C, the disposable dielectric layer 533 can be removed selective to the first blocking dielectric layer 501 and the semiconductor material of the substrate (9, 10). In one embodiment, the layer 533 can be removed employing an isotropic etch chemistry that is selective to the first blocking dielectric layer 501 and the semiconductor material of the semiconductor material layer 10. An undercut region can be formed underneath the bottommost surface of the first blocking dielectric layer 501.

Referring to FIG. 6D, an additional blocking dielectric layer 514 can be deposited by a conformal deposition method. The additional blocking dielectric layer 514 can be deposited on a sidewall of the first blocking dielectric layer 501 and a top surface of a remaining portion of the substrate (9, 10) that remains after conversion of the surface portion of the substrate into a portion of the disposable dielectric layer 533 at the processing step of FIG. 6B. The additional blocking dielectric layer 514 can include silicon oxide, silicon nitride, a silicon oxynitride, or a combination thereof. In one embodiment, the additional blocking dielectric layer 514 includes silicon oxide. The thickness of the additional blocking dielectric layer 514 can be in a range from 1 nm to 12 nm, although lesser and greater thicknesses can also be employed. The additional blocking dielectric layer 514 can contact a peripheral portion of the bottommost surface of the first blocking dielectric layer 501. A bottommost surface of the additional blocking dielectric layer 514 can be formed below a horizontal plane including a bottommost surface of the first blocking dielectric layer 501. The tip of the horizontal portion of the first blocking dielectric layer 501 protrudes into the sidewall of the horizontal part of the additional blocking dielectric layer 514. In one embodiment, the additional blocking dielectric layer 501 can have a homogeneous material composition throughout the entirety thereof.

Subsequently, a set (504, 505L, 601) of material layers can be subsequently formed on the inner sidewall and the top surface of the additional blocking dielectric layer 514 and over the alternating stack (32, 42) and the insulating cap layer 70. In one embodiment, the set of material layers can comprise a memory material layer 504, a tunneling dielectric layer 505L, and an optional first semiconductor channel layer 601. The same processing steps can be employed to form the set (504, 505L, 601) of material layers as in the first embodiment.

Figure 6F:
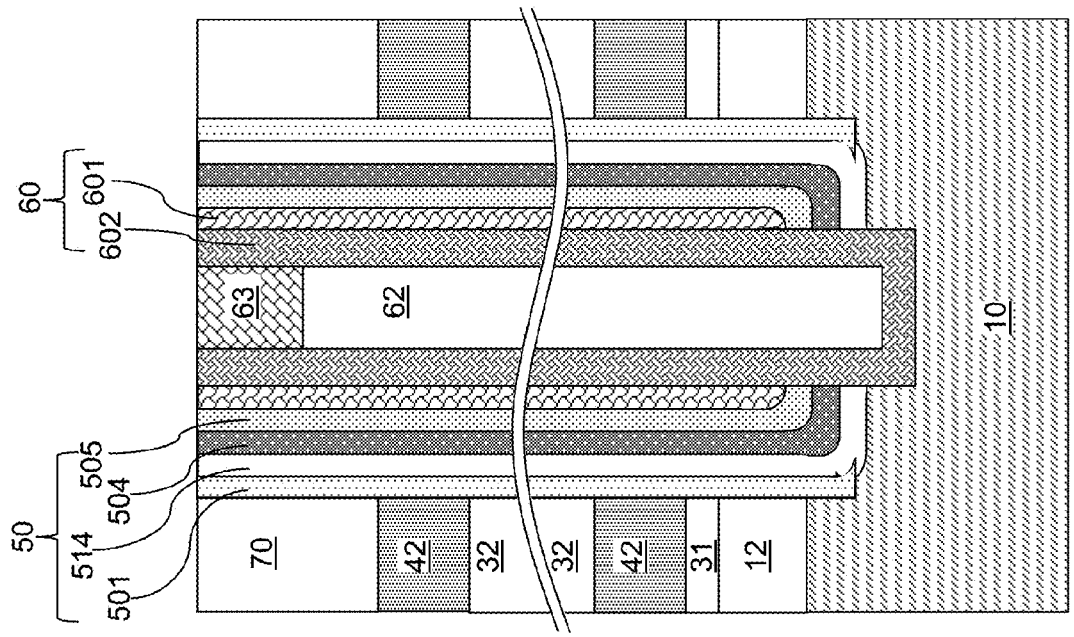
Figure 6E:
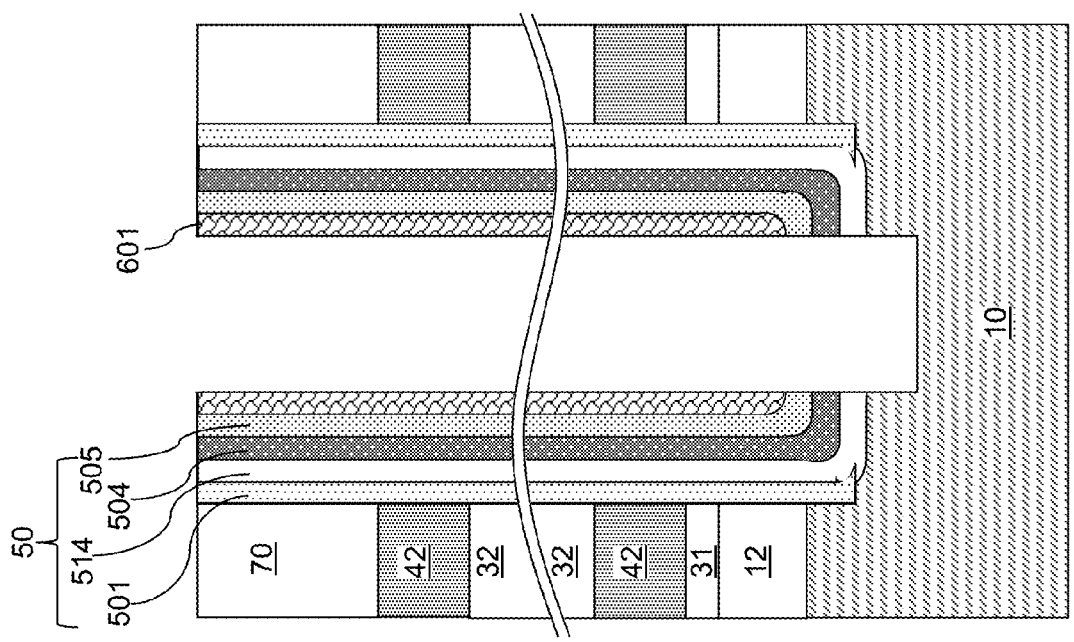

Referring to FIG. 6E, the processing steps of FIG. 2E can be performed to form a memory film 50, which includes the first blocking dielectric layer 501, the additional blocking dielectric layer 514, the memory material layer 504, and the tunneling dielectric 505.

Referring to FIG. 6F, a semiconductor channel 60 including a first semiconductor channel layer 601 and a second semiconductor channel layer 602 can be formed as in the first embodiment. Further, a dielectric core 62 and a drain region 63 can be formed as in the first embodiment.

The structure of FIG. 6F is a fifth exemplary memory stack structure, which comprises a first blocking dielectric layer 501 vertically extending at least from a bottommost layer (e.g., the bottommost sacrificial material layer 42) of the stack (32, 42) to a topmost layer (e.g., the topmost sacrificial material layer 42) of the stack, comprising a dielectric metal oxide having a dielectric constant greater than 7.9, and contacting a sidewall of the memory opening and a first surface of the semiconductor substrate (9, 10). The first blocking dielectric layer 501 comprises a planar bottommost surface and a concave inner sidewall that adjoins an inner periphery of the planar bottommost surface. The additional blocking dielectric layer 514 is located inside of the first blocking dielectric layer 501 and contacts at least a portion of an inner sidewall of the first blocking dielectric layer 501. A memory material layer 504 contacts an inner sidewall of the additional blocking dielectric layer 514 and a top surface of a horizontal portion of the additional blocking dielectric layer 514. A semiconductor channel 60 is laterally surrounded by the memory material layer 504 and contacts a second surface of the semiconductor substrate (9, 10).

A bottom surface of the additional blocking dielectric layer 514 can be located below the horizontal plane including the bottom surface of the first blocking dielectric layer 501, and the top surface of the additional blocking dielectric layer 514 can be located above the horizontal plane including the bottom surface of the first blocking dielectric layer 501. The additional blocking dielectric layer 514 can contact a third surface of the semiconductor substrate (9, 10). The outer periphery of the third surface adjoins the first surface and the inner periphery of the third surface adjoins the second surface.

Referring to FIGS. 7A-7D, sequential vertical cross-sectional views of a memory opening within the exemplary structure are shown during formation of a sixth exemplary memory stack structure within the memory opening according to a sixth embodiment of the present disclosure.

The sixth exemplary memory stack structure of FIG. 7A can be formed by depositing a stack of a first blocking dielectric layer 501 and a dielectric nitride layer 515L into a memory opening 49 provided in the exemplary structure of FIG. 1. The first blocking dielectric layer 501 can have the same composition and thickness as in the first through fifth embodiments. The dielectric nitride layer 515L comprises a dielectric nitride such as silicon nitride. The dielectric nitride layer 515L can be deposited by a conformal deposition method such as chemical vapor deposition. The thickness of the dielectric nitride layer 515L can be in a range from 0.6 nm to 6 nm, although lesser and greater thicknesses can also be employed.

Referring to FIG. 7B, an anisotropic etch can be performed to remove horizontal portions of the dielectric nitride layer 515L. The chemistry of the anisotropic etch can be selective to the material of the first blocking dielectric layer 501, i.e., not remove the material of the first blocking dielectric layer 501 in any substantial quantity while etching the material of the dielectric nitride layer 515L. An opening is formed through a horizontal portion of the dielectric nitride layer 515L at a bottom of the cavity 49' in each memory opening. Each remaining vertical portion of the dielectric nitride layer 515L within each memory opening constitutes a spacer 515. Each spacer 515 can be homeomorphic to a torus. A top surface of a horizontal portion of the first blocking dielectric layer 501 is physically exposed at a bottom of the cavity 49' in each memory opening. Each spacer 515 comprises a dielectric nitride (which can be a nitride of a semiconductor element such as silicon nitride), and contacts an inner sidewall of the first blocking dielectric layer 501.

Referring to FIG. 7C, physically exposed horizontal portions of the first blocking dielectric layer 501 can be etched by an isotropic etch process. The portion of the first blocking dielectric layer 501 overlying the alternating stack (32, 42) can be removed during the isotropic etch process. Further, a horizontal portion of the first blocking dielectric layer 501 at a bottom of the cavity 49' in each memory opening can be etched through the opening in the spacer 515. The spacer 515 is present on the vertical portion of the first blocking dielectric layer 501 within each memory opening during the isotropic etching of physically exposed portions of the first blocking dielectric layer 501. Specifically, a horizontal portion of the first blocking dielectric layer 501 can be etched at a bottom of each memory opening through the opening in the spacer 515. Etching of the horizontal portion of the first blocking dielectric layer 501 forms a peripheral undercut cavity 49P by removing a peripheral portion of the first blocking dielectric layer 501 underneath the spacer 515. The isotropic etch process can be a wet etch process or an isotropic dry etch process. The chemistry of the isotropic etch process can be selected so that the isotropic etch removes the material of the first blocking dielectric layer 501 selective to the material of the spacer 515, such as a HF wet etch. The material of the first blocking dielectric layer 501 is etched isotropically during the isotropic etch process. A top semiconductor surface of the substrate (9, 10) is physically exposed at the bottom of each memory opening.

A portion of the first blocking dielectric layer 501 remains within each memory opening. Each remaining first blocking dielectric layer 501 can be topologically homeomorphic to a torus. A concave surface is formed on the bottommost portion of the inner surface of the first blocking dielectric layer 501 because the material of the first blocking dielectric layer 501 is isotropically removed from a closed shape edge at which the inner surface of the spacer 503 adjoins the bottom surface of the spacer 515. A top semiconductor surface of the substrate (9, 10) is physically exposed at a bottom of each memory opening.

Referring to FIG. 7D, an additional blocking dielectric layer 523 can be formed directly on the substrate (9, 10) and on the inner sidewall of the first blocking dielectric layer 501 by simultaneous oxidation of the spacer 515 into a first dielectric material portion 525A and a surface portion of the substrate (9, 10) located underneath the top semiconductor surface of the substrate (9, 10) directly underneath the cavity 49' into a second dielectric material portion 525B. The oxidation process is a conversion process that employs a thermal oxidation process and/or a plasma oxidation process. In one embodiment, the first dielectric material portion 525A comprises silicon oxide or silicon oxynitride, and the second dielectric material portion 525B comprises silicon oxide.

The duration of the oxidation process can be selected such that the outer periphery of the first dielectric material portion 525A is adjoined to an inner periphery of a bottom portion of the second dielectric material portion 525B. Thus, the additional blocking dielectric layer 525 can be formed as an integral structure, i.e., a structure consisting of a single contiguous region. The first dielectric material portion 525A and the second dielectric material portion 525B can have the same material composition if the dielectric nitride of the spacer 515 is silicon nitride as formed, and is completely oxidized to become silicon oxide, and if the semiconductor material of the semiconductor material layer 10 comprises silicon. Alternately, the first dielectric material portion 525A and the second dielectric material portion 525B can have can have different material compositions if the semiconductor material of the semiconductor material layer 10 comprises a material other than silicon or if the oxidation process converts the spacer 515 into a first dielectric material portion 525A that includes silicon oxynitride. Thus, the first dielectric material portion 525A can comprise a dielectric oxide or a dielectric oxynitride, and is formed by oxidation of the dielectric nitride.

The additional blocking dielectric layer 525 can be formed in, and fill, the peripheral undercut cavity 49P within each memory opening. In one embodiment, a bottommost surface of the additional blocking dielectric layer 525 can be further recessed than the bottom surface of the first blocking dielectric layer 501 within a respective memory opening. A convex surface of the additional blocking dielectric layer 525 contacts a concave surface of the first blocking dielectric layer 501. Further, another convex surface of the additional blocking dielectric layer 525 contacts a concave surface of the semiconductor substrate (9, 10).

Referring to FIG. 7E, a set (504, 505L, 601) of material layers can be subsequently formed on the inner sidewall and the top surface of the additional blocking dielectric layer 525 and over the alternating stack (32, 42) and the insulating cap layer 70. In one embodiment, the set of material layers can comprise a memory material layer 504, a tunneling dielectric layer 505L, and an optional first semiconductor channel layer 601. The same processing steps can be employed to form the set (504, 505L, 601) of material layers as in the first embodiment.

Referring to FIG. 7F, the processing steps of FIG. 2E can be performed to form a memory film 50, which includes the first blocking dielectric layer 501, the additional blocking dielectric layer 525, the memory material layer 504, and the tunneling dielectric 505.

Referring to FIG. 7G, a semiconductor channel 60 including a first semiconductor channel layer 601 and a second semiconductor channel layer can be formed as in the first embodiment. Further, a dielectric core 62 and a drain region 63 can be formed as in the first embodiment.

The structure of FIG. 7G is a sixth exemplary memory stack structure, which comprises a first blocking dielectric layer 501 vertically extending at least from a bottommost layer (e.g., the bottommost sacrificial material layer 42) of the stack (32, 42) to a topmost layer (e.g., the topmost sacrificial material layer 42) of the stack, comprising a dielectric metal oxide having a dielectric constant greater than 7.9, and contacting a sidewall of the memory opening and a first surface of the semiconductor substrate (9, 10). The first blocking dielectric layer 501 comprises a planar bottommost surface and a concave inner sidewall that adjoins an inner periphery of the planar bottommost surface. The additional blocking dielectric layer 525 is located inside of the first blocking dielectric layer 501 and contacts at least a portion of an inner sidewall of the first blocking dielectric layer 501. A memory material layer 504 contacts an inner sidewall of the additional blocking dielectric layer 525 and a top surface of a horizontal portion of the additional blocking dielectric layer 525. A semiconductor channel 60 is laterally surrounded by the memory material layer 504 and contacts a second surface of the semiconductor substrate (9, 10).

The additional blocking dielectric layer 525 can have a first dielectric material portion 525A having a first composition and a second dielectric material portion 525B having a second composition, which can be the same as, or can be different from, the first composition. A bottom surface of the second dielectric material portion 525B can be located below the horizontal plane including the bottom surface of the first blocking dielectric layer 501, and the top surface of the second dielectric material portion 525B can be located above the horizontal plane including the bottom surface of the first blocking dielectric layer 501. The additional blocking dielectric layer 525 can contact a third surface of the semiconductor substrate (9, 10). The outer periphery of the third surface adjoins the first surface and the inner periphery of the third surface adjoins the second surface. In one embodiment, the first dielectric material portion 525A can comprise a dielectric oxynitride including a compound of at least one semiconductor element, oxygen, and nitrogen.

The embodiments of the present disclosure may have the following non-limiting advantages. By etching the high-k (e.g., aluminum oxide) first blocking dielectric layer 501 prior to forming the memory material layer 504, the first blocking dielectric layer 501 is selectively etched inside the memory opening 49 without etching or attacking the memory material layer, the tunnel dielectric or first the channel layer. This improves device performance. Since there is no need to etch layer 501 during the anisotropic memory film 50 etch at the bottom of the memory opening (e.g., as shown in FIG. 2E), the etch time may be decreased, which may result in less etching damage to the first semiconductor channel layer 601, which improves carrier mobility and cell current. Furthermore, the bottom memory profile after the anisotropic etch (e.g., the etch in FIG. 2E) may be more rectangular than triangular or truncated cone in shape, which increases contact area between channel 60 and the substrate 10, thus improving cell current and lower select gate transistor resistance. Finally, since layer 501, such as an aluminum oxide layer, is etched prior to deposition of the memory material layer 504 and other layers, layer 501 may have a lower crystallization state than after deposition of these overlying layers because the deposition of additional layers may cause layer 501 to crystallize. For example, as-deposited layer 501 may be amorphous or partially polycrystalline aluminum oxide layer, which is easier to etch using a wet etching process, such as HF or hot phosphoric acid wet etch, than polycrystalline aluminum oxide. Thus, layer 501 is preferably deposited in wholly or partially amorphous state.

Figure 8:
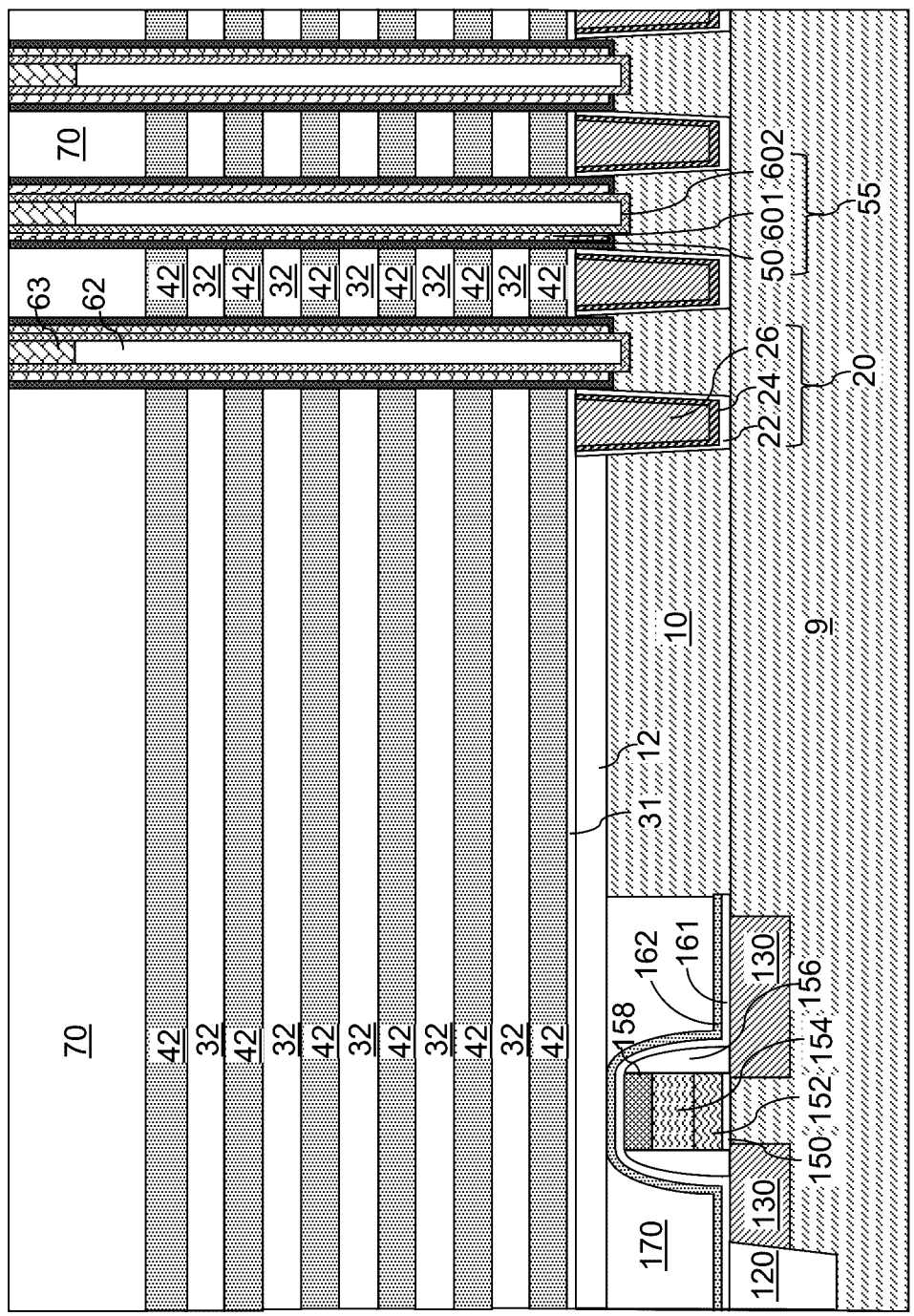
FIG. 8 is a vertical cross-sectional view of the exemplary structure after formation of memory stack structures according to an embodiment of the present disclosure.

Referring to FIG. 8, the exemplary structure is illustrated after formation of memory stack structures 55, each of which includes a memory film 50 and a semiconductor channel (601, 602). The memory stack structures 55 can be a set of first exemplary memory stack structures according to the first embodiment, a set of second exemplary memory stack structures according to the second embodiment, a set of third exemplary memory stack structures according to the third embodiment, a set of fourth exemplary memory stack structures according to the fourth embodiment, a set of fifth exemplary memory stack structures according to the fifth embodiment, or a set of sixth exemplary memory stack structures according to the sixth embodiment.

Figure 9:
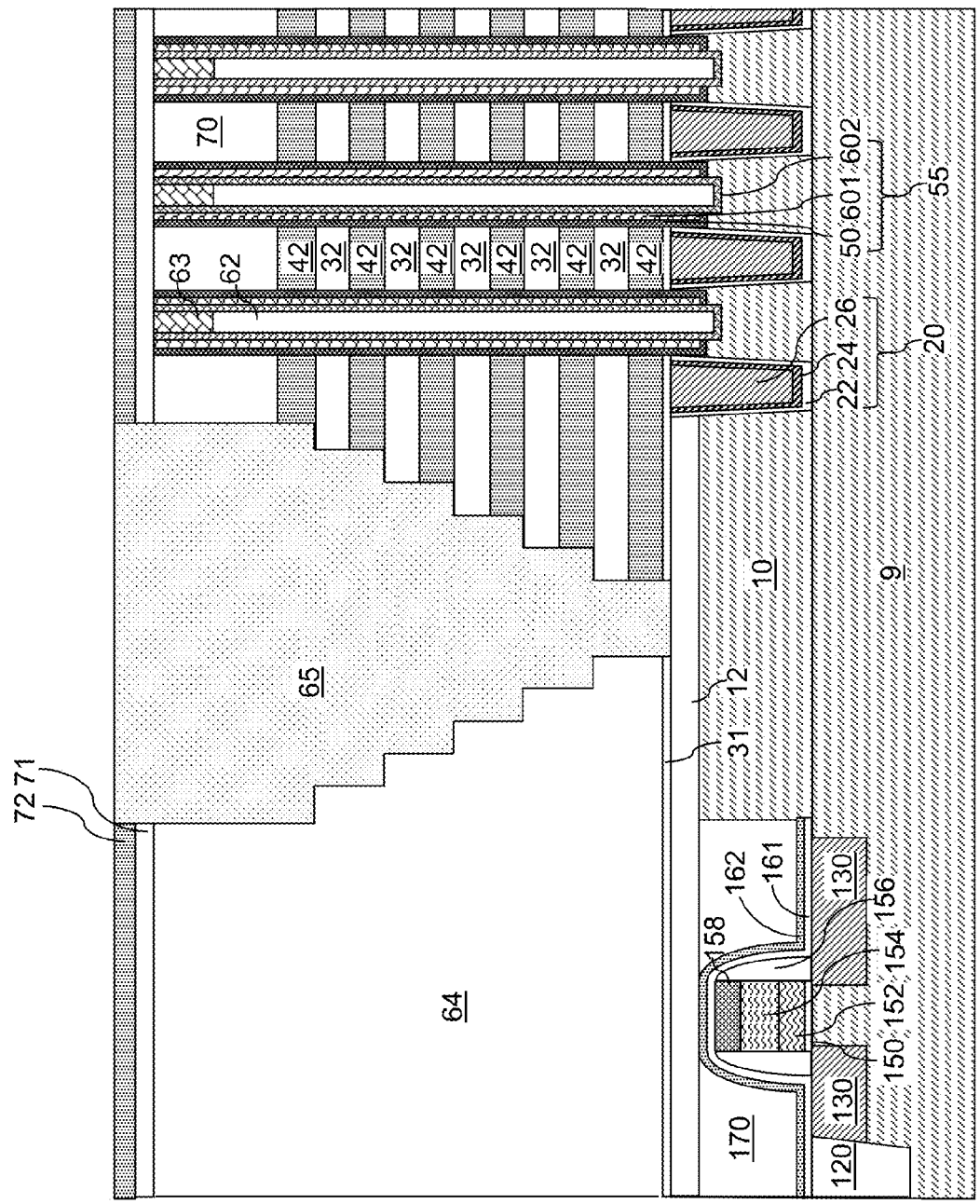
FIG. 9 is a vertical cross-sectional view of the exemplary structure after formation of stepped terraces and a retro-stepped dielectric fill material portion according to an embodiment of the present disclosure.

Referring to FIG. 9, at least one dielectric cap layer (71, 72) can be optionally formed over the planarization dielectric layer 70. In one embodiment, the at least one dielectric cap layer (71, 72) can include a first dielectric cap layer 71 and a second dielectric cap layer 72. In one embodiment, the first and second dielectric cap layers (71, 72) can include dielectric materials such as silicon oxide, a dielectric metal oxide, and/or silicon nitride.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed. Subsequently, the trench can be filled with an optional dielectric material such as silicon oxide. Excess portions of the dielectric material can be removed from above the top surface of the at least one dielectric cap layer (71, 72) by a planarization process such as chemical mechanical planarization and/or a recess etch. The top surfaces of the at least one dielectric cap layer (71, 72) can be employed as a stopping surface during the planarization. The remaining dielectric material in the trench constitutes a dielectric material portion 64.

Figure 10A:
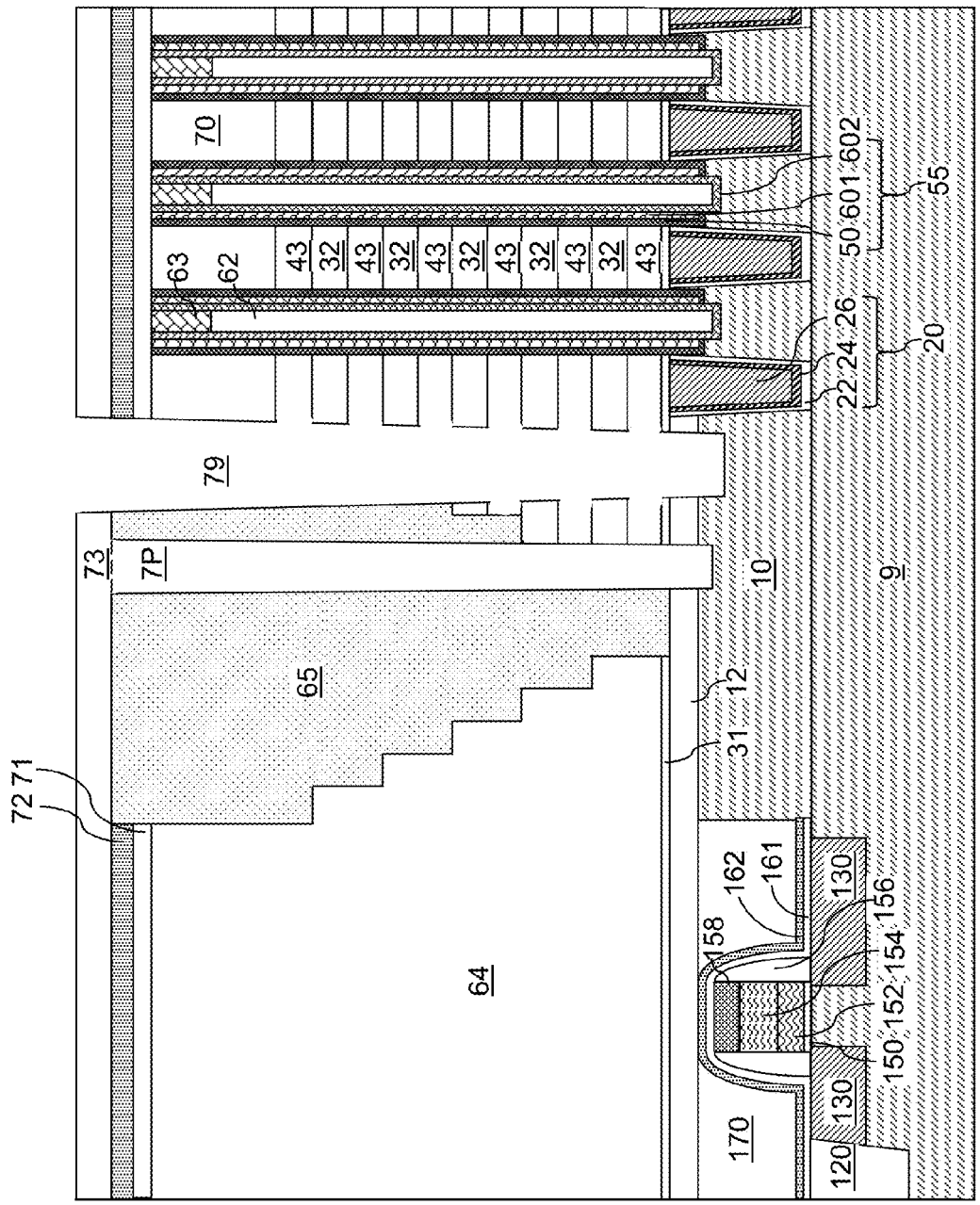
FIG. 10A is a vertical cross-sectional view of the exemplary structure after formation of a backside via cavity and backside recesses according to an embodiment of the present disclosure.
Figure 10B:
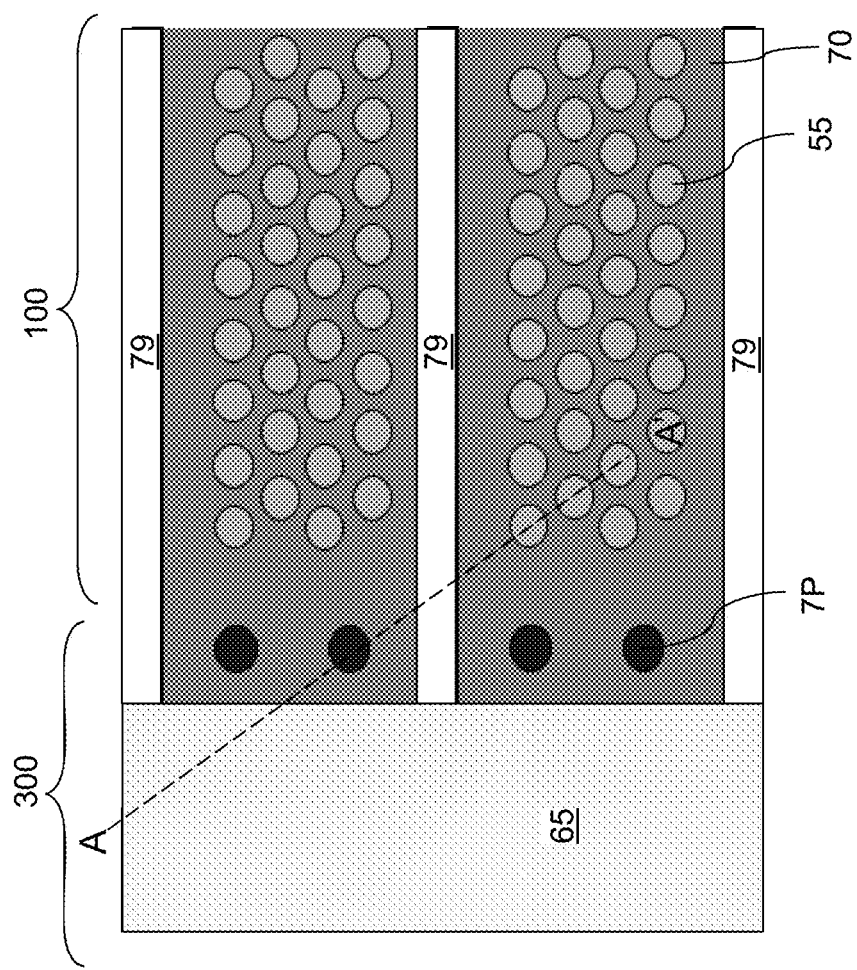
FIG. 10B is a top-down view of the exemplary structure of FIG. 10A. The vertical plane A-A' is the plane of the vertical cross-sectional view of FIG. 10A.

Referring to FIGS. 10A and 10B, a stepped cavity can be formed within a contact region, which can straddle the dielectric material portion 64 and a portion of the alternating stack (32, 42). Alternatively, the dielectric material portion 64 may be omitted and the stepped cavity may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer (71, 72), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

At least one dielectric support pillar 7P may be optionally formed through the retro-stepped dielectric material portion 65 and/or through the alternating stack (32, 42). In one embodiment, the at least one dielectric support pillar 7P can be formed in a contact region 300, which is located adjacent to a device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer (71, 72) concurrently with deposition of the at least one dielectric support pillar 7P can be present over the at least one dielectric cap layer (71, 72) as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer (71, 72) concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer (71, 72) can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown)

may be formed by implantation of dopant atoms into a portion of the semiconductor material layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three dimensional NAND strings having a plurality of device levels disposed above the substrate (9, 10). In this case, each backside recess 43 can define a space for receiving a respective word line of the array of monolithic three dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout.

Figure 11:
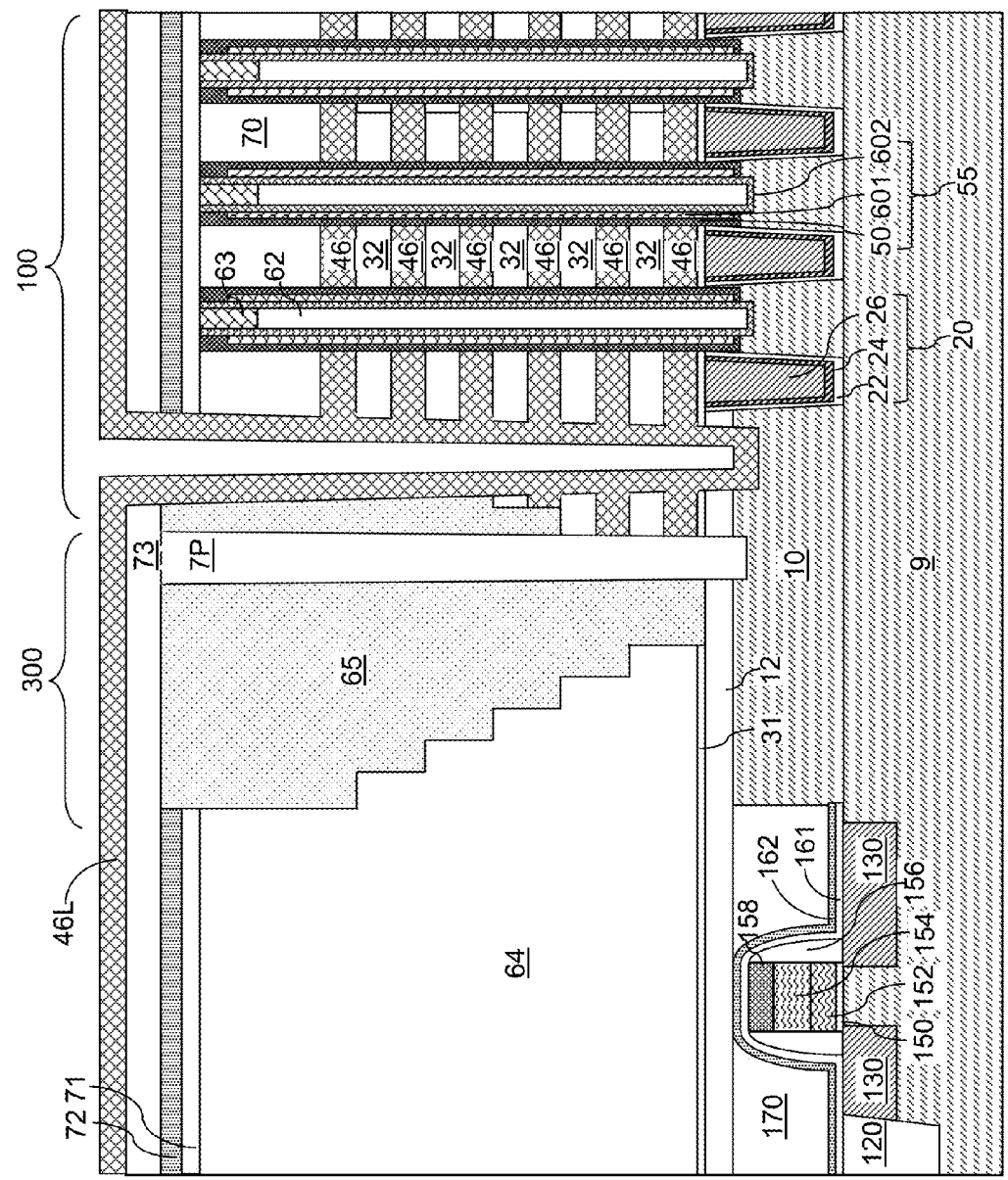
FIG. 11 is a vertical cross-sectional view of the exemplary structure after formation of electrically conductive layers in the backside recesses according to an embodiment of the present disclosure.

Referring to FIG. 11, a conductive material can be deposited in the plurality of backside recesses 43, on sidewalls of the at least one the backside contact trench 79, and over the top surface of the dielectric pillar material layer 73 (or the topmost layer of the exemplary structure in case the dielectric pillar material layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition.

A plurality of electrically conductive layers 46 is present in the plurality of backside recesses 43, and a contiguous conductive material layer 46L can be formed on the sidewalls of each backside contact trench 79 and over the dielectric pillar material layer 73 (or the topmost layer of the exemplary structure in case the dielectric pillar material layer 73 is not employed). Thus, at least a portion of each sacrificial material layer 42 can be replaced with an electrically conductive layer 46, which is a conductive material portion.

Figure 12A:
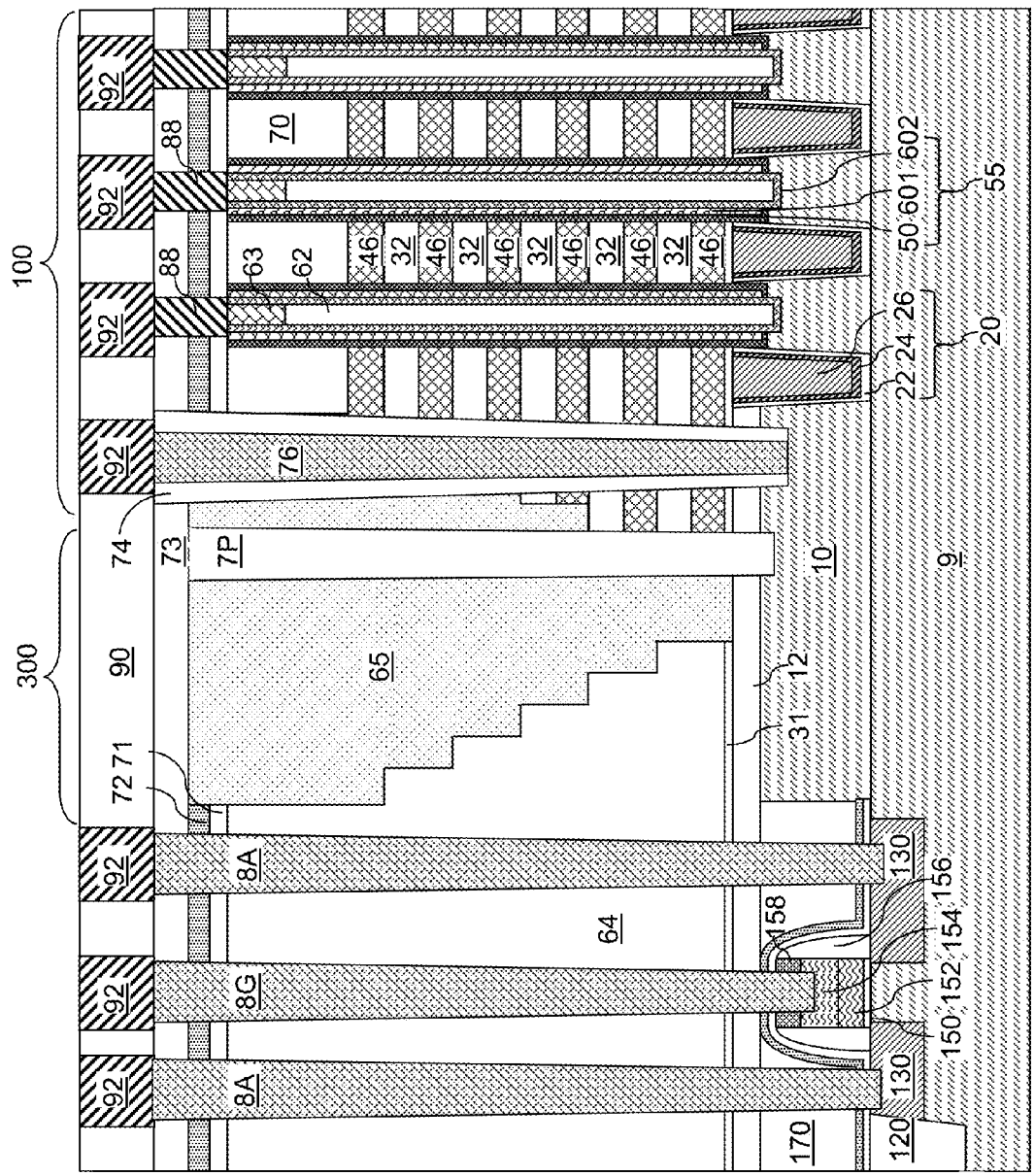
FIGS. 12A and 12B are vertical cross-sectional view of regions of the exemplary structure after formation of a backside via spacer, a backside via contact structure, and conductive line structures according to an embodiment of the present disclosure.
Figure 12B:
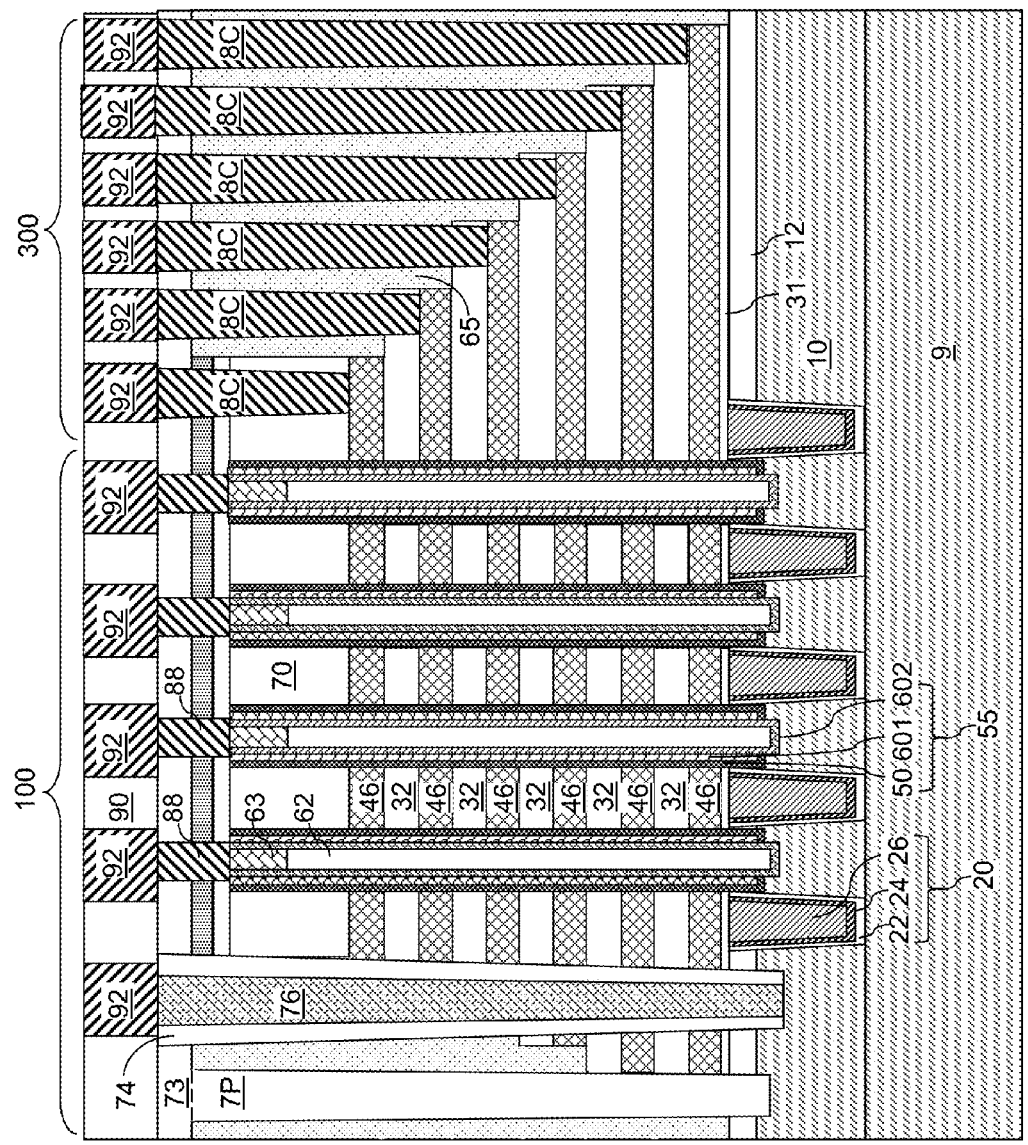

Referring to FIGS. 12A and 12B, the deposited conductive material is etched back from the sidewalls of each backside contact trench 79 and from above the dielectric pillar material layer 73 (or the topmost layer of the exemplary structure in case the dielectric pillar material layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

An insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the exemplary structure, and can be lithographically patterned to form openings within a contact region in which formation of contact via structures for the electrically conductive layers 46 is desired. Via cavities can be formed through the retro-stepped dielectric material portion 65 by transfer of the pattern of the opening by an anisotropic etch. Each via cavity can vertically extend to a top surface of a respective electrically conductive layer 46.

The cavity laterally surrounded by the insulating spacer 74 and the various via cavities in the peripheral device region are filled with a conductive material to form various contact via structures. For example, a backside contact via structure 76 can be formed in the cavity surrounded by the insulating spacer 74, a gate contact via structure 8G is formed in each gate via cavity, and an active region via structure 8A is formed in each active region via cavity. Further, control gate contact via structures 8C can be formed within each contact via cavity that extends to a top surface of the electrically conductive layers 46. Similarly, drain contact via structures 88 can be formed to provide electrical contact to the drain regions 63.

Subsequently, a line-level dielectric layer 90 can be formed over the dielectric pillar material layer 73, and various conductive line structures 92 can be formed in the line-level dielectric layer 90 to provide electrical contact to the various contact via structures (76, 8G, 8A, 88, 8C). A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulator layers 32 can be located over a semiconductor substrate. Each of the word lines 46 and insulator layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulator layers 32 can comprise silicon oxide layers, the plurality of word lines 46 can comprise tungsten or a combination of titanium nitride and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10. A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element. An array of drain regions 63 contacts a respective semiconductor channel (601, 602) within the array of memory stack structures 55. A top surface of the dielectric material layer, i.e., the insulating cap layer 70, can be coplanar with top surfaces of the drain regions 63.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of fabricating a memory device, comprising:
   forming a stack including an alternating plurality of material layers and insulator layers over a substrate;
   forming a memory opening extending through the stack;
   forming a first blocking dielectric layer in the memory opening and over the stack;
   forming a continuous material layer over the first blocking dielectric layer;
   forming a spacer by anisotropically etching the continuous material layer, wherein a top surface of a horizontal portion of the first blocking dielectric layer is physically exposed within an opening in the spacer;
   etching the horizontal portion of the first blocking dielectric layer at a bottom of the memory opening through the opening in the spacer, whereby a top semiconductor surface of the substrate is physically exposed at a bottom of the memory opening;
   forming a memory material layer comprising a charge trapping material or patterned conductive material portions over the top semiconductor surface of the substrate and over a sidewall of the spacer within the memory opening after the continuous material layer is patterned into the spacer; and
   forming a tunneling dielectric layer and a semiconductor channel over the memory material layer.

2. The method of claim 1, further comprising forming an additional blocking dielectric layer directly on the substrate prior to forming the memory material layer.

3. The method of claim 2, wherein the additional blocking dielectric layer is formed by conformal deposition of a dielectric material.

4. The method of claim 3, wherein the additional blocking dielectric layer is deposited on an inner sidewall of the spacer.

5. The method of claim 4, wherein the additional blocking dielectric layer is a silicon oxide layer.

6. The method of claim 3, further comprising removing the spacer selective to the first blocking dielectric layer, wherein the additional blocking dielectric layer is deposited on a sidewall of the first blocking dielectric layer and the top semiconductor surface of the substrate.

7. The method of claim 3, wherein a bottommost surface of the additional blocking dielectric layer is formed within a horizontal plane including a bottommost surface of the first blocking dielectric layer.

8. The method of claim 3, further comprising:
   forming a disposable dielectric layer by converting the spacer into a first dielectric material portion and converting a surface portion of the substrate into a second dielectric material portion, wherein the disposable dielectric layer comprises the first dielectric material portion and the second dielectric material portion; and
   removing the disposable dielectric layer selective to the first blocking dielectric layer and a semiconductor material of the substrate.

9. The method of claim 8, wherein the additional blocking dielectric layer is deposited on a sidewall of the first blocking dielectric layer and a top surface of a remaining portion of the substrate that remains after converting the surface portion of the substrate.

10. The method of claim 8, wherein a bottommost surface of the additional blocking dielectric layer is formed below a horizontal plane including a bottommost surface of the first blocking dielectric layer.

11. The method of claim 2, wherein the additional blocking dielectric layer is formed by simultaneous conversion of the spacer into a first dielectric material portion and a surface portion of the substrate into a second dielectric material portion.

12. The method of claim 11, wherein the spacer comprises a semiconductor material.

13. The method of claim 12, wherein the first dielectric material portion comprises a dielectric oxide including a compound of at least one semiconductor element in the semiconductor material and oxygen.

14. The method of claim 11, wherein the spacer comprises a dielectric nitride.

15. The method of claim 14, wherein the first dielectric material portion comprises a dielectric oxide or a dielectric oxynitride, and is formed by oxidation of the dielectric nitride.

16. The method of claim 11, wherein a periphery of the first dielectric material portion is adjoined to a periphery of a bottom portion of the second dielectric material portion.

17. The method of claim 11, wherein the first dielectric material portion and the second dielectric material portion have different material compositions.

18. The method of claim 11, wherein:
   a bottom surface of the second dielectric material portion is located below a horizontal plane including a bottom surface of the first blocking dielectric layer; and
   a top surface of the second dielectric material portion is located above the horizontal plane including the bottom surface of the first blocking dielectric layer.

19. The method of claim 1, wherein the memory material layer is deposited directly on the spacer and the top semiconductor surface of the substrate.

20. The method of claim 19, wherein a bottommost surface of the memory material layer is coplanar with a bottom surface of the first blocking dielectric layer.

21. The method of claim 1, wherein etching of the horizontal portion of the first blocking dielectric layer forms a peripheral undercut cavity by removing a peripheral portion of the first blocking dielectric layer underneath the spacer.

22. The method of claim 21, further comprising forming an additional blocking dielectric layer directly on the substrate and in the peripheral undercut cavity prior to forming the memory material layer.

23. The method of claim 21, wherein the memory material layer is deposited in the peripheral undercut cavity.

24. The method of claim 1, wherein the first blocking dielectric layer comprises a dielectric metal oxide having a dielectric constant greater than 7.9.

25. The method of claim 1, wherein the first blocking dielectric layer comprises aluminum oxide.

26. The method of claim 1, wherein the memory material layer comprises a charge trapping material or a floating gate material.

27. The method of claim 1, further comprising:
removing the material layers from the stack selective to the insulator layers to form a plurality of backside recesses; and
forming a plurality of electrically conductive layers in the plurality of backside recesses.

28. The method of claim 27, wherein:
the memory device comprises a vertical NAND device; and
at least one of the electrically conductive layers in the stack comprises, or is electrically connected to, a word line of the vertical NAND device.

29. The method of claim 28, wherein:
the NAND device comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the stack comprise, or are in electrical contact with, the plurality of control gate electrodes and extends from the device region to a contact region containing a plurality of electrically conductive via connections; and
the substrate comprises a silicon substrate containing a driver circuit for the NAND device.

30. The method of claim 1, wherein the memory material layer is formed over an inner sidewall of the spacer.

31. The method of claim 1, wherein the additional blocking dielectric layer is formed after formation of the first blocking dielectric layer.

32. The method of claim 31, wherein the spacer is formed directly on the first blocking dielectric layer, and the additional blocking dielectric layer is formed directly on the spacer.

33. The method of claim 32, wherein a first portion of the additional blocking dielectric layer physically contacts a lower portion of the first blocking dielectric layer, and a second portion of the additional blocking dielectric layer is laterally spaced from the first blocking dielectric layer by the spacer.

34. The method of claim 33, wherein a horizontal portion of the additional blocking dielectric layer is formed directly on a top surface of the first blocking dielectric layer.

* * * * *